United States Patent
Sato et al.

(10) Patent No.: US 11,232,944 B2
(45) Date of Patent: Jan. 25, 2022

(54) FABRICATION METHOD OF SEMICONDUCTOR DEVICE

(71) Applicant: Semiconductor Energy Laboratory Co., Ltd., Kanagawa-ken (JP)

(72) Inventors: Masataka Sato, Tochigi (JP); Kayo Kumakura, Tochigi (JP); Seiji Yasumoto, Tochigi (JP); Satoru Idojiri, Tochigi (JP)

(73) Assignee: Semiconductor Energy Laboratory Co., Ltd.

( * ) Notice: Subject to any disclaimer, the term of this patent is extended or adjusted under 35 U.S.C. 154(b) by 17 days.

(21) Appl. No.: 16/769,433

(22) PCT Filed: Dec. 3, 2018

(86) PCT No.: PCT/IB2018/059553
§ 371 (c)(1),
(2) Date: Jun. 3, 2020

(87) PCT Pub. No.: WO2019/116150
PCT Pub. Date: Jun. 20, 2019

(65) Prior Publication Data
US 2020/0388776 A1    Dec. 10, 2020

(30) Foreign Application Priority Data

Dec. 12, 2017  (JP) .............................. JP2017-237751

(51) Int. Cl.
*H01L 21/02* (2006.01)
*H01L 27/32* (2006.01)
(Continued)

(52) U.S. Cl.
CPC .... *H01L 21/02252* (2013.01); *C03C 17/3626* (2013.01); *C03C 17/3649* (2013.01);
(Continued)

(58) Field of Classification Search
CPC ......... H01L 21/02252; H01L 21/02244; H01L 51/003; H01L 27/1262; H01L 27/322;
(Continued)

(56) References Cited

U.S. PATENT DOCUMENTS

| 10,693,097 | B2 | 6/2020 | Yasumoto et al. |
| 2018/0061639 | A1* | 3/2018 | Yamazaki ......... H01L 21/02694 |
| 2020/0067027 | A1 | 2/2020 | Yasumoto et al. |

FOREIGN PATENT DOCUMENTS

| JP | 02-205016 A | 8/1990 |
| JP | 2007-220749 A | 8/2007 |

(Continued)

OTHER PUBLICATIONS

International Search Report (Application No. PCT/IB2018/059553) dated Feb. 26, 2019.
(Continued)

*Primary Examiner* — Kyoung Lee
(74) *Attorney, Agent, or Firm* — Husch Blackwell LLP

(57) ABSTRACT

A method of fabricating a semiconductor device, which includes a separation step and has a high yield, is provided. A metal layer is formed over a substrate, fluorine is supplied to the metal layer, and the metal layer is then oxidized, whereby a metal compound layer is formed. A functional layer is formed over the metal compound layer, heat treatment is performed on the metal compound layer, and the functional layer is separated from the substrate with use of the metal compound layer. By performing first plasma treatment using a gas containing fluorine, fluorine can be supplied to the metal layer. By performing second plasma treatment using a gas containing oxygen, the metal layer supplied with fluorine can be oxidized.

19 Claims, 23 Drawing Sheets

(51) Int. Cl.
  *C03C 17/36* (2006.01)
  *C03C 17/38* (2006.01)
  *H01L 29/786* (2006.01)
  *H01L 51/56* (2006.01)
  *H01L 27/12* (2006.01)
  *H01L 51/00* (2006.01)

(52) U.S. Cl.
  CPC ........ *C03C 17/38* (2013.01); *H01L 21/02244* (2013.01); *H01L 27/1262* (2013.01); *H01L 27/322* (2013.01); *H01L 29/7869* (2013.01); *H01L 51/003* (2013.01); *H01L 51/56* (2013.01); *C03C 2217/258* (2013.01); *C03C 2217/281* (2013.01); *C03C 2218/154* (2013.01); *C03C 2218/31* (2013.01); *C03C 2218/32* (2013.01); *H01L 27/1225* (2013.01); *H01L 51/0097* (2013.01); *H01L 2227/323* (2013.01); *H01L 2227/326* (2013.01)

(58) Field of Classification Search
  CPC . H01L 29/7869; H01L 51/56; H01L 27/1225; H01L 51/0097; H01L 2227/323; H01L 2227/326; H01L 2251/5338; H01L 51/0024; H01L 51/0012; H01L 27/3244; H01L 2251/566; H01L 21/02; C03C 17/3626; C03C 17/3649; C03C 17/38; C03C 2217/258; C03C 2217/281; C03C 2218/154; C03C 2218/31; C03C 2218/32; C03C 17/3668; C03C 17/3621; C03C 17/36; Y02E 10/549; B32B 9/00; B32B 15/04; B32B 27/34; H05B 33/02; H05B 33/10

See application file for complete search history.

(56) References Cited

FOREIGN PATENT DOCUMENTS

| | | |
|---|---|---|
| JP | 2013-077521 A | 4/2013 |
| JP | 2015-223823 A | 12/2015 |

OTHER PUBLICATIONS

Written Opinion (Application No. PCT/IB2018/059553) dated Feb. 26, 2019.

* cited by examiner

FIG. 18E1  FIG. 18E2 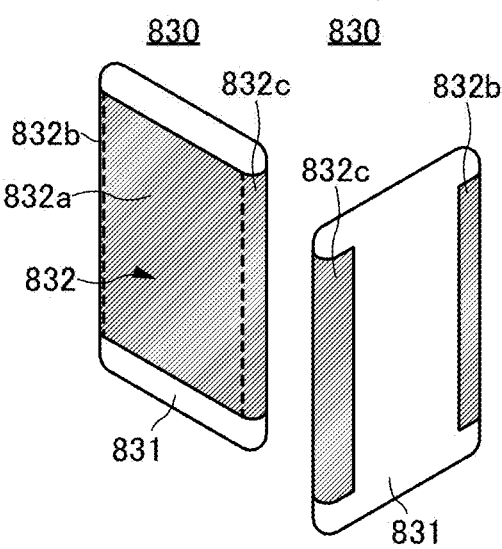
FIG. 18F1  FIG. 18F2 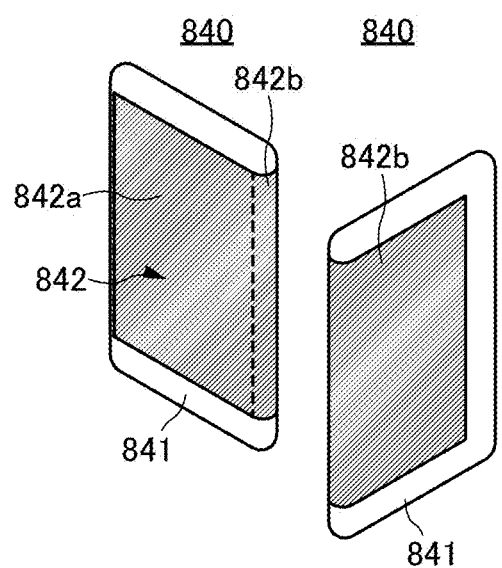

1000nm

1000nm

FABRICATION METHOD OF SEMICONDUCTOR DEVICE

This application is a 371 of international application PCT/IB32018/059553 filed on Dec. 3, 2018 which is incorporated herein by reference.

TECHNICAL FIELD

One embodiment of the present invention relates to a separation method, a fabrication method of a semiconductor device, and a fabrication method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

In this specification and the like, a semiconductor device generally means a device that can function by utilizing semiconductor characteristics. A transistor, a semiconductor circuit, a display device, a light-emitting device, an input device, an input/output device, an arithmetic device, a memory device, and the like are each an embodiment of a semiconductor device. In addition, an imaging device, an electro-optical device, a power generation device (including a thin film solar cell, an organic thin film solar cell, and the like), and an electronic device may include a semiconductor device.

BACKGROUND ART

Display devices using organic electroluminescence (EL) elements or liquid crystal elements have been known. Other examples of display devices include a light-emitting device provided with a light-emitting element such as a light-emitting diode (LED), and electronic paper performing display with an electrophoretic method or the like.

The basic structure of an organic EL element is a structure in which a layer containing a light-emitting organic compound is provided between a pair of electrodes. By voltage application to this element, light emission can be obtained from the light-emitting organic compound. By using such an organic EL element, a thin, lightweight display device with high contrast and low power consumption can be obtained.

In addition, when a semiconductor element such as a transistor and a display element such as an organic EL element are formed over a substrate (a film) having flexibility, a flexible display device can be achieved.

Disclosed in Patent Document 1 is a method for fabricating a flexible display device, in which a supporting substrate (a glass substrate) provided with a heat-resistant resin layer and electronic elements over a sacrificial layer is irradiated with laser light and the heat-resistant resin layer is peeled from the glass substrate.

PRIOR ART DOCUMENT

[Patent Document]

[Patent Document 1] Japanese Published Patent Application No. 2015-223823

SUMMARY OF THE INVENTION

Problems to be Solved by the Invention

An object of one embodiment of the present invention is to provide a novel separation method, a novel fabrication method of a semiconductor device, or a novel fabrication method of a display device. An object of one embodiment of the present invention is to provide a separation method, a fabrication method of a semiconductor device, or a fabrication method of a display device each being low in cost and high in mass productivity. An object of one embodiment of the present invention is to provide a high-yield separation method. An object of one embodiment of the present invention is to fabricate a semiconductor device or a display device by using a large-sized substrate. An object of one embodiment of the present invention is to fabricate a semiconductor device or a display device at low temperatures.

An object of one embodiment of the present invention is to provide a display device with low power consumption. An object of one embodiment of the present invention is to provide a highly reliable display device. An object of one embodiment of the present invention is to reduce the thickness or weight of a display device. An object of one embodiment of the present invention is to provide a display device having flexibility or a curved surface. An object of one embodiment of the present invention is to provide a display device less likely to be broken. An object of one embodiment of the present invention is to provide a novel display device, a novel input/output device, a novel electronic device, or the like.

Note that the descriptions of these objects do not preclude the existence of other objects. One embodiment of the present invention does not need to achieve all the objects. Other objects can be derived from the descriptions of the specification, the drawings, and the claims.

Means for Solving the Problems

One embodiment of the present invention is a method of fabricating a semiconductor device, in which a metal layer is formed over a substrate, fluorine is supplied to the metal layer, and the metal layer is then oxidized to form a metal compound layer, a functional layer is formed over the metal compound layer, heat treatment is performed on the metal compound layer, and the functional layer and the substrate are separated from each other with use of the metal compound layer. A first layer containing a resin or a resin precursor may be formed on and in contact with the metal compound layer. A resin layer may be formed by heating the first layer by heat treatment.

One embodiment of the present invention is a method of fabricating a semiconductor device, including forming a metal layer over a substrate, forming a first metal compound layer by supplying fluorine to the metal layer, forming a second metal compound layer by oxidizing the first metal compound layer, forming a functional layer over the second metal compound layer, performing heat treatment on the second metal compound layer, and separating the functional layer from the substrate with use of one or both of the first metal compound layer and the second metal compound layer. A first layer containing a resin or a resin precursor may be formed over and in contact with the second metal compound layer. A resin layer may be formed by heating the first layer by the heat treatment.

One embodiment of the present invention is a method of fabricating a semiconductor device, including forming a metal layer over a substrate, forming a first metal compound layer by performing first plasma treatment using a gas containing fluorine on the metal layer, forming a second metal compound layer by performing second plasma treatment using a gas containing oxygen on the first metal compound layer, forming a functional layer over the second metal compound layer, performing heat treatment on the second metal compound layer, and separating the functional layer from the substrate with use of one or both of the first metal compound layer and the second metal compound layer.

One embodiment of the present invention is a method of fabricating a semiconductor device, including forming a metal layer over a substrate, forming a first metal compound layer by performing first plasma treatment using a gas containing fluorine on the metal layer, forming a second metal compound layer by performing second plasma treatment using a gas containing oxygen on the first metal compound layer, forming a first layer containing a resin or a resin precursor over the second metal compound layer, forming a resin layer by heating the first layer, and separating the resin layer from the substrate with use of one or both of the first metal compound layer and the second metal compound layer. The resin layer preferably contains one or both of a polyimide resin and an acrylic resin.

The first plasma treatment is preferably $C_4F_8$ plasma treatment.

The second plasma treatment is preferably $H_2O$ plasma treatment.

The metal layer preferably contains one or more of titanium, molybdenum, aluminum, tungsten, indium, zinc, gallium, tantalum, and tin.

The second metal compound layer preferably includes a first layer over the substrate and a second layer over the first layer. The first layer contains a larger amount of metal than the second layer. The second layer contains a larger amount of oxygen than the first layer. The second metal compound layer preferably includes, at an interface between the first layer and the second layer or in its vicinity, a region containing a larger amount of fluorine than the other region.

Effect of the Invention

According to one embodiment of the present invention, a novel separation method, a novel fabricating method of a semiconductor device, or a novel fabricating method of a display device can be provided. According to one embodiment of the present invention, a separation method, a fabrication method of a semiconductor device, or a fabrication method of a display device each being low in cost and high in mass productivity can be provided. According to one embodiment of the present invention, a high-yield separation method can be provided. According to one embodiment of the present invention, a semiconductor device or a display device can be fabricated by using a large-sized substrate. According to one embodiment of the present invention, a semiconductor device or a display device can be fabricated at low temperatures.

According to one embodiment of the present invention, a display device with low power consumption can be provided. According to one embodiment of the present invention, a highly reliable display device can be provided. According to one embodiment of the present invention, reduction in thickness or weight of a display device becomes possible. According to one embodiment of the present invention, a display device having flexibility or a curved surface can be provided. According to one embodiment of the present invention, a display device less likely to be broken can be provided. According to one embodiment of the present invention, a novel display device, a novel input/output device, a novel electronic device, or the like can be provided.

Note that the descriptions of these effects do not preclude the existence of other effects. One embodiment of the present invention does not need to have all the effects. Other effects can be derived from the descriptions of the specification, the drawings, and the claims.

BRIEF DESCRIPTION OF THE DRAWINGS

FIGS. 1A-1G2 are cross-sectional views illustrating an example of a separation method.

FIGS. 6A-6B2 are cross-sectional views illustrating an example of a fabrication method of a display device.

FIGS. 9A-9C2 are cross-sectional views illustrating an example of a fabrication method of a display device.

FIGS. 18A-18F2 are drawings illustrating examples of electronic devices.

MODE FOR CARRYING OUT THE INVENTION

Figure 1A:
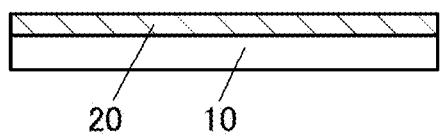

Embodiments will be described in detail with reference to the drawings. Note that the present invention is not limited to the following description, and it will be readily appreciated by those skilled in the art that modes and details of the present invention can be modified in various ways without departing from the spirit and scope of the present invention.

Thus, the present invention should not be construed as being limited to the descriptions in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not denoted by reference numerals in some cases.

In addition, the position, size, range, or the like of each structure illustrated in drawings does not represent the actual position, size, range, or the like in some cases for easy understanding. Thus, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a separation method and a fabrication method of a display device of one embodiment of the present invention will be described with reference to FIG. 1 to FIG. 13.

In this embodiment, a display device that includes a transistor and an organic EL element (also referred to as an active matrix organic EL display device) will be described as an example.

The display device can be a flexible device by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other functional elements.

In the separation method of one embodiment of the present invention, a metal compound layer containing fluorine and oxygen is used to separate, from a substrate, a functional layer (a layer including a functional element such as a transistor or a display element) formed over the metal compound layer. For example, a metal layer is formed over the substrate first, supplied with fluorine and then oxygen (oxidized), and after that heat treatment is performed. With use of the metal compound layer that is formed by subjecting the metal layer to multiple processes as described above, the functional layer formed over the metal compound layer can be separated from the substrate.

In the separation method of one embodiment of the present invention, a metal compound layer including a region high in fluorine is formed. Then, the metal compound layer is heated so that a portion with low adhesion is formed in or near the region. The portion with low adhesion can be easily peeled by application of physical force. Thus, the functional layer formed over the metal compound layer can be separated from the substrate in a high yield.

Specifically, plasma treatment using a gas containing fluorine and plasma treatment using a gas containing oxygen are performed on the metal layer, whereby the metal compound layer including a region high in fluorine can be formed.

The metal compound layer includes a first layer over the substrate and a second layer over the first layer. The region high in fluorine is formed at an interface between the first layer and the second layer or in the vicinity thereof. The first layer and the second layer are different from each other in composition. The first layer contains a larger amount of metal than the second layer. The second layer contains a larger amount of oxygen than the first layer. By heating the metal compound layer with such a configuration, the adhesion between the first layer and the second layer can be lowered.

Heating may cause the volume of the region high in fluorine to increase and the interface between the first layer and the second layer to be uneven. In the separation step, the interface between the first layer and the second layer that contains unevenness or the vicinity thereof becomes the separation interface. Note that "the interface or the vicinity thereof" includes the interface between the first layer and the second layer, the inside of the first layer, the inside of the second layer, a region in contact with the first layer, and a region in contact with the second layer.

The surface of a metal layer after plasma treatment using a gas containing fluorine (a metal compound layer) has low adhesion to other materials, e.g., repelling other materials, in some cases. Thus, when the plasma treatment is immediately followed by the step of processing a metal layer or the step of forming another layer, defects may appear in the process. In view of that, plasma treatment using a gas containing oxygen is performed after plasma treatment using a gas containing fluorine, in the separation method of one embodiment of the present invention. This can improve the yield of the steps following the plasma treatment.

In the separation method of one embodiment of the present invention, a portion having low adhesion is formed in the metal compound layer, so that the functional layer formed over the metal compound layer can be separated from the substrate. The step of irradiating a wide area of the substrate with laser light for separating the functional layer from the substrate is unnecessary.

When a wide area of the substrate is irradiated with laser light, a linear laser beam is preferably used; however, laser apparatus for linear laser beam irradiation is expensive and has high running costs. The separation method of one embodiment of the present invention does not require the laser apparatus and thus can reduce cost significantly. In addition, application to a large-sized substrate is easy.

Furthermore, if a foreign object such as dust is adhered to the light irradiation surface of the substrate when the metal compound layer or the like is irradiated with laser light through the substrate, it may cause non-uniform light irradiation and generation of a portion with a low separating property. This may lead to a reduction in the yield of the step of separating the functional layer from the substrate. In this embodiment, the heat treatment improves the separating property of the metal compound layer. Even if a foreign object is adhered to the substrate, heating non-uniformity does not easily occur in the metal compound layer, which inhibits a reduction in yield of the step of separating the functional layer from the substrate.

Since the separation method of one embodiment of the present invention does not include a step of irradiating a wide area of the substrate with laser light, the substrate can be prevented from being damaged by laser light irradiation. After being used once, the substrate substantially maintains its strength and thus can be reused, which results in cost reduction.

The fabrication method of a display device of this embodiment will be specifically described below.

Note that thin films that constitute the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

Thin films that constitute the display device (e.g., insulating films, semiconductor films, or conductive films) can be formed by a method such as spin coating, dipping, spray coating, ink-jetting, dispensing, screen printing, offset printing, a doctor knife, slit coating, roll coating, curtain coating, or knife coating.

When thin films that constitute the display device are processed, a lithography method or the like can be used for the processing. Alternatively, island-shaped thin films may be formed by a film formation method using a shadow mask. Alternatively, a nanoimprinting method, a sandblasting method, a lift-off method, or the like may be used for the processing of the thin films. Examples of the photolithography method include a method in which a resist mask is formed over a thin film to be processed, the thin film is processed by etching or the like, and the resist mask is removed, and a method in which a photosensitive thin film is formed and then exposed to light and developed to be processed into a desired shape.

When light is used in the lithography method, any of an i-line (a wavelength of 365 nm), a g-line (a wavelength of 436 nm), and an h-line (a wavelength of 405 nm), for example, or light combining any of them can be used for light exposure. In addition, ultraviolet light, KrF laser light, ArF laser light, or the like can also be used. Exposure may be performed by liquid immersion light exposure technique. Furthermore, as the light used for the exposure, extreme ultra-violet (EUV) light or X-rays may be used. Instead of the light used for the exposure, an electron beam can also be used. It is preferable to use extreme ultra-violet light, X-rays, or an electron beam because extremely minute processing can be performed. Note that in the case where exposure by scanning of a beam such as an electron beam is performed, a photomask is not needed.

For etching of the thin films, a dry etching method, a wet etching method, a sandblasting method, or the like can be used.

[Separation Method]

The separation method of this embodiment is illustrated in FIG. 1. FIG. 2(A) is an enlarged view of FIG. 1(A), FIG. 2(B) is an enlarged view of FIG. 1(B), and FIGS. 2(C) to 2(E) are enlarged views of a metal compound layer 22 and its vicinity in FIGS. 1(C), 1(E), and 1(G1).

Figure 2A:
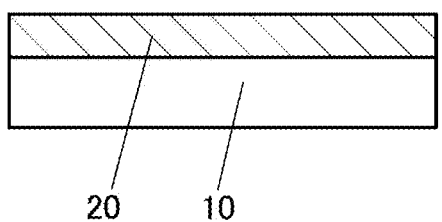
FIGS. 2A-2E are cross-sectional views illustrating an example of a separation method.
Figure 2B:
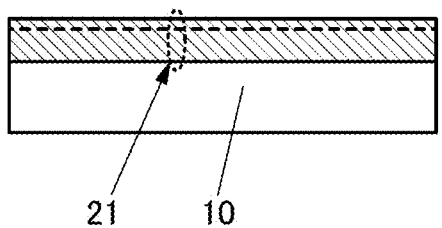

First, a metal layer 20 is formed over a formation substrate 10 (FIG. 1(A)).

The formation substrate 10 has rigidity high enough for easy transfer and has heat resistance to the temperature applied in the fabrication process. Examples of a material that can be used for the formation substrate 10 include glass, quartz, ceramics, sapphire, a resin, a semiconductor, a metal, and an alloy. Examples of the glass include alkali-free glass, barium borosilicate glass, and aluminoborosilicate glass.

For the metal layer 20, a variety of metals and alloys can be used. The metal layer 20 contains one or more of titanium, molybdenum, aluminum, tungsten, indium, zinc, gallium, tantalum, tin, hafnium, yttrium, zirconium, magnesium, lanthanum, cerium, neodymium, bismuth, and niobium. The metal layer 20 preferably contains one or more of titanium, molybdenum, aluminum, tungsten, indium, zinc, gallium, tantalum, and tin. It is particularly preferable to use a titanium film as the metal layer 20.

There is no particular limitation on the formation method of the metal layer 20. The metal layer 20 can be formed by, for example, a sputtering method, a plasma-enhanced CVD method, an evaporation method, a sol-gel method, an electrophoretic method, a spray method, or the like.

The thickness of the metal layer 20 is preferably 1 nm to 100 nm inclusive, and further preferably 10 nm to 50 nm inclusive.

Next, fluorine is supplied to the metal layer 20. In this embodiment, fluorine is supplied to the metal layer 20 by performing first plasma treatment using a gas containing fluorine (FIG. 1(B)).

Figure 1B:

In FIG. 1(B), the metal layer 20 on which the first plasma treatment has been performed is referred to as a metal compound layer 21. Note that it is possible to directly form the metal compound layer 21 that contains fluorine, instead of forming the metal layer 20.

Here, the metal layer 20 is preferably formed as a single layer as illustrated in FIG. 2(A). The metal layer 20 formed as a single layer is divided into two (upper and lower) layers by being supplied with fluorine, which constitute the metal compound layer 21 with a two-layer structure, as illustrated in FIG. 2(B).

Examples of the gas used in the first plasma treatment include a gas containing fluorine such as octafluorocyclobutane ($C_4F_8$), carbon tetrafluoride ($CF_4$), trifluoromethane ($CHF_3$), sulfur hexafluoride ($SF_6$), or nitrogen trifluoride ($NF_3$). In particular, the use of a gas containing carbon and fluorine can increase the separating property.

It is particularly preferable to perform $C_4F_8$ plasma treatment as the first plasma treatment.

The duration of the plasma treatment is not particularly limited and can be 1 second to 5 minutes inclusive, and preferably 10 seconds to 1 minute inclusive, for example.

The power of the plasma treatment is not particularly limited and can be 0.1 kW to 5 kW inclusive, and preferably higher than 0.5 kW and lower than or equal to 3 kW, for example. When the power is higher than 0.5 kW, the force required for separation can be reduced.

Next, oxygen is supplied to the metal layer 20 to which fluorine has been supplied (metal compound layer 21). In this embodiment, the metal compound layer 21 is oxidized by performing second plasma treatment using a gas containing oxygen (FIG. 1(C)). Plasma 27a illustrated in FIG. 1(B) and plasma 27b illustrated in FIG. 1(C) are different from each other.

Figure 1C:

In FIG. 1(C), the metal layer 20 on which the second plasma treatment has been performed (metal compound layer 21) is referred to as a metal compound layer 22.

Figure 2C:
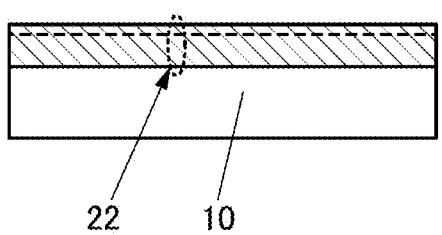

Here, the metal compound layer 22 illustrated in FIG. 2(C) has a two (upper and lower)-layer structure in the same way as the metal compound layer 21 illustrated in FIG. 2(B). Although not illustrated, the interface between the two layers and the vicinity thereof are high in fluorine.

As a gas used for the second plasma treatment, a gas containing oxygen such as oxygen or water vapor (1420) is given. A gas containing oxygen and argon may also be used.

In particular, $H_2O$ plasma treatment is preferably performed as the second plasma treatment.

Oxidation of the metal compound layer 21 can also be achieved by performing heat treatment on the metal compound layer 21 while flowing oxygen; however, fluorine supplied in the first plasma treatment may be released from the metal compound layer 21 (metal compound layer 22) depending on the conditions. Thus, the formation of the metal compound layer 22 is preferably achieved by the second plasma treatment.

As the other methods for oxidizing the metal compound layer 21, ozone treatment, an ion implantation method, an ion doping method, a plasma immersion ion implantation method, and the like can be used.

The metal compound layer 22 can contain a metal, an alloy, and a compound thereof (e.g., a metal oxide). The metal compound layer 22 contains one or more of titanium, molybdenum, aluminum, tungsten, indium, zinc, gallium, tantalum, tin, hafnium, yttrium, zirconium, magnesium, lanthanum, cerium, neodymium, bismuth, and niobium. The metal compound layer 22 preferably contains one or more of titanium, molybdenum, aluminum, tungsten, indium, zinc, gallium, tantalum, and tin.

For the metal compound layer 22, an oxide of any of a variety of metals can be used. Examples of the metal oxide include titanium oxide ($TiO_x$), molybdenum oxide, aluminum oxide, tungsten oxide, indium zinc oxide, and an In—Ga—Zn oxide. Note that the metal oxide may contain silicon; for example, indium tin oxide containing silicon (ITSO) may be used.

Other examples of the metal oxide include indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, and niobate.

The thickness of the metal compound layer 22 is preferably 1 nm to 200 nm inclusive, and further preferably 10 nm to 100 nm inclusive, for example. Note that the thickness of the metal layer 20 changes through the plasma treatment, heat treatment, or the like, and thus the thickness of the finally formed metal compound layer 22 may be different from the thickness of the deposited metal layer 20.

In the case where a titanium film is formed as the metal layer 20, and $C_4F_8$ plasma treatment as the first plasma treatment and $H_2O$ plasma treatment as the second plasma treatment are performed; a titanium oxide film containing fluorine is formed as the metal compound layer 22. The upper layer of the two-layer structure is high in oxygen, in particular, and the lower layer is high in titanium. The interface of the two layers or the vicinity thereof is high in fluorine.

Next, a first layer 30 is preferably formed over the metal compound layer 22 (FIG. 1 (D)).

Figure 1D:
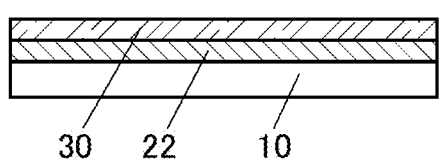

FIG. 1(D) illustrates an example in which the first layer 30 is formed over the entire surface of the metal compound layer 22 by a coating method. One embodiment of the present invention is not limited to this example and a printing method or the like may be employed to form the first layer 30. The first layer 30 having an island-like shape, the first layer 30 having an opening or an uneven shape, or the like may be formed over the formation substrate 10 and the metal compound layer 22.

Any of a variety of resin materials (including resin precursors) can be used to form the first layer 30.

The first layer 30 is preferably formed using a thermosetting material.

The first layer 30 may be formed using a material with photosensitivity or a material without photosensitivity (also referred to as a non-photosensitive material).

When a photosensitive material is used, a resin layer 32 with a desired shape can be formed by removing part of the first layer 30 by a photolithography method.

The first layer 30 is preferably formed using a material containing a polyimide resin or a polyimide resin precursor. The first layer 30 can be formed using, for example, a material containing a polyimide resin and a solvent, a material containing a polyamic acid and a solvent, or the like. Since a polyimide resin is a material suitably used for a planarization film or the like of a display device, the film formation apparatus and the material can be shared. Thus, there is no need to prepare a new apparatus or a new material to obtain the structure of one embodiment of the present invention.

Other examples of resin materials which can be used to form the first layer 30 include an acrylic resin, an epoxy resin, a polyamide resin, a polyimide-amide resin, a siloxane resin, a benzocyclobutene-based resin, a phenol resin, and precursors of these resins.

Examples of the formation method of the first layer 30 include spin coating, dipping, spray coating, ink-jetting, dispensing, screen printing, offset printing, a doctor knife, a slit coating, a roll coating, a curtain coating, and a knife coating.

Alternatively, the first layer 30 or the resin layer 32 may be formed using varnish. For example, the top of the metal compound layer 22 is coated with polyimide varnish and then dried, whereby the first layer 30 or the resin layer 32 can be formed.

Figure 1E:
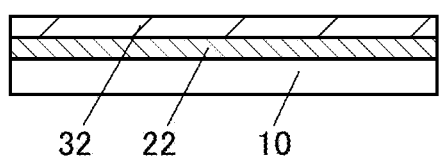

Next, heat treatment is performed on the first layer 30 to form the resin layer 32 (FIG. 1(E)). Note that the formation of the resin layer 32 (and the first layer 30) may be omitted.

The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

When heating is performed in an air atmosphere or while a gas containing oxygen is supplied, the resin layer 32 is sometimes colored by oxidation to have a decreased visible-light transmitting property.

For that reason, heating is preferably performed while a nitrogen gas is supplied. In that case, the heating atmosphere can contain less oxygen than an air atmosphere; thus, oxidation of the resin layer 32 can be inhibited and the resin layer 32 can have an increased visible-light transmitting property.

Figure 2D:
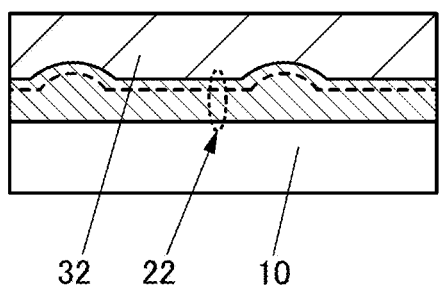

Here, as illustrated in FIGS. 2(A) to 2(C), the metal layer 20, the metal compound layer 21, and the metal compound layer 22 before heating each have a relatively flat surface. In addition, the interface between the two (upper and lower) layers included in the metal compound layer 21 and that in the metal compound layer 22 before heating are relatively flat. By contrast, as illustrated in FIG. 2(D), the interface between the two (upper and lower) layers in the metal compound layer 22 after the heat treatment is uneven. Specifically, bumps are formed on the lower layer. Due to the effects of this unevenness, the surface of the metal compound layer 22 may also become uneven.

The heat treatment can reduce released gas components (e.g., hydrogen or water) in the resin layer 32. In particular, the heating is preferably performed at a temperature higher than or equal to the fabrication temperature of each layer formed over the resin layer 32. Thus, a gas released from the resin layer 32 in the fabrication process of the transistor can be significantly reduced.

The temperature the heat treatment is preferably 100° C. to 500° C. inclusive, further preferably 100° C. to 450° C. inclusive, still further preferably 100° C. to 400° C. inclusive, yet still further preferably 100° C. to 350° C. inclusive.

In the case where the fabrication temperature of the transistor is up to 350° C., for example, a film to be the resin layer 32 is preferably heated at 350° C. to 450° C. inclusive, further preferably at 350° C. to 400° C. inclusive. Thus, a gas released from the resin layer 32 in the fabrication process of the transistor can be significantly reduced.

The temperature of the heat treatment is preferably set to lower than or equal to the maximum temperature in fabricating the transistor. When the temperature of the heat treatment is set to lower than or equal to the maximum temperature in fabricating the transistor, a manufacturing apparatus for the fabrication process of the transistor, for example, can be utilized, which can reduce additional capital investment and the like. As a result, display devices with reduced production costs can be achieved. When the fabrication temperature of the transistor is up to 350° C., for example, the temperature of the heat treatment is preferably lower than or equal to 350° C.

The maximum temperature in fabricating the transistor is preferably equal to the temperature of the heat treatment, because it is possible to prevent the maximum temperature in fabricating the display device from being increased by performing the heat treatment and to reduce the released gas components in the resin layer 32.

The duration of the heat treatment is preferably 5 minutes to 24 hours inclusive, further preferably 30 minutes to 12 hours inclusive, still further preferably 30 minutes to 2 hours inclusive, for example. Note that the duration of the heat treatment is not limited thereto. The duration of the heat treatment may be shorter than 5 minutes in the case where the heat treatment is performed by a rapid thermal annealing (RTA) method, for example.

As the heating apparatus, it is possible to use a variety of apparatuses such as an electric furnace and an apparatus for heating an object by heat conduction or heat radiation from a heating element such as a resistance heating element. For example, an RTA apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment by using a high-temperature gas. The use of an RTA apparatus can shorten the treatment time and thus the RTA apparatus is preferred in terms of mass production. Furthermore, the heat treatment may be performed using an in-line heating apparatus.

Note that the heat treatment sometimes changes the thickness of the resin layer 32 from the thickness of the first layer 30. For example, removal of the solvent that was contained in the first layer 30 or increase in density with proceeding curing sometimes causes the volume of the first layer 30 to decrease and the thickness of the resin layer 32 to be smaller than that of the first layer 30.

Before the heat treatment, heat treatment (also referred to as pre-baking treatment) for removing the solvent contained in the first layer 30 may be performed. The temperature of the pre-baking treatment can be set as appropriate in accordance with the material to be used. For example, the pre-baking treatment can be performed at 50° C. to 180° C. inclusive, 80° C. to 150° C. inclusive, or 90° C. to 120° C. inclusive. Alternatively, the heat treatment may function as the pre-baking treatment, and the solvent contained in the first layer 30 may be removed by the heat treatment.

The resin layer 32 has flexibility. The resin layer 32 is higher in flexibility than the formation substrate 10.

The thickness of the resin layer 32 is preferably greater than or equal to 0.01 μm and less than 10 μm, further preferably 0.1 μm to 5 μm inclusive, still further preferably 0.5 μm to 3 μm inclusive. By forming the resin layer thin, the display device can be fabricated at a low cost. The display device can be lightweight and thin. The display device can have higher flexibility. The use of a solution having low viscosity facilitates the formation of the resin layer 32 having a small thickness. The thickness of the resin layer 32 is not limited to the above and may be greater than or equal to 10 μm. For example, the thickness the resin layer 32 may be 10 μm to 200 μm inclusive. The resin layer 32 with a thickness of greater than or equal to 10 μm is suitable because the rigidity of the display device can be increased.

The thermal expansion coefficient of the resin layer 32 is preferably 0.1 ppm/° C. to 50 ppm/° C. inclusive, further preferably 0.1 ppm/° C. to 20 ppm/° C. inclusive, still further preferably 0.1 ppm/° C. to 10 ppm/° C. inclusive. The lower the thermal expansion coefficient of the resin layer 32 is, the more the generation of a crack in a layer included in a transistor or the like and breakage of a transistor or the like which are caused owing to the heating can be prevented.

The visible-light transmitting property of the resin layer 32 is not particularly limited. For example, the resin layer 32 may be a colored layer or a transparent layer. In the case where the resin layer 32 is positioned on the display surface side of the display device, the resin layer 32 preferably has a high visible-light transmitting property.

Figure 1F:
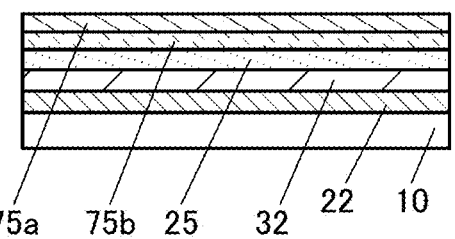
Figure 1F:
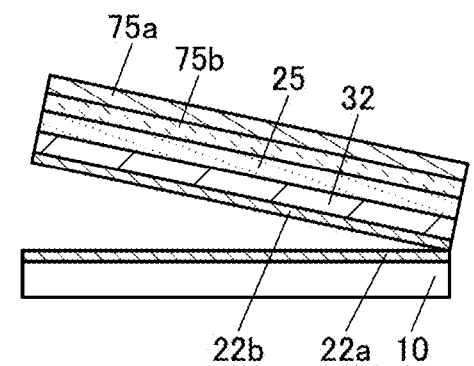
Figure 1F:
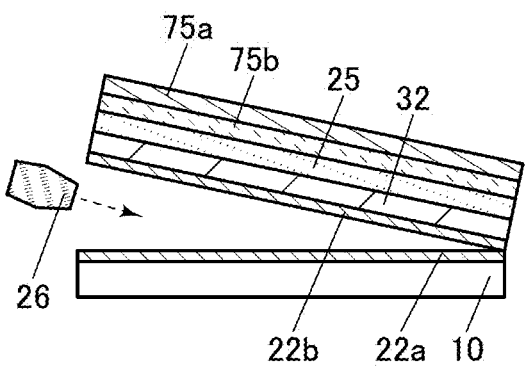

Next, a functional layer 25 is formed over the resin layer 32 (FIG. 1(F)).

The functional layer 25 is formed at a temperature lower than or equal to the upper temperature limit of the resin layer 32. An insulating layer or a functional element (e.g., a transistor or a display element), for example, can be provided as the layer 25.

The functional layer 25 preferably includes an insulating layer. The insulating layer preferably has a function of blocking hydrogen, oxygen, and water that are released from the metal compound layer 22, the resin layer 32, and the like in a later heating step.

The functional layer 25 preferably includes at least one of a silicon nitride film, a silicon oxynitride film, and a silicon nitride oxide film, for example. A silicon nitride film is formed by a plasma-enhanced CVD method using a film formation gas containing a silane gas, a hydrogen gas, and an ammonia ($NH_3$) gas, for example. There are no particular limitations on the thickness of the insulating layer. The thickness can be, for example, 50 nm to 1000 nm inclusive, preferably 100 nm to 300 nm inclusive.

Note that in this specification and the like, "silicon oxynitride" is a material that contains more oxygen than nitrogen in its composition. Moreover, in this specification and the like, "silicon nitride oxide" is a material that contains more nitrogen than oxygen in its composition.

The layer functional layer 25 can include a transistor.

The channel formation region of the transistor preferably contains a metal oxide. The metal oxide can serve as an oxide semiconductor. A transistor containing a metal oxide in the channel formation region can be formed at a temperature lower than or equal to 350° C., or even lower than or equal to 300° C. Thus, the resin layer 32 is not required to have high heat resistance. Accordingly, the upper temperature limit of the resin layer 32 can be low, widening the range of choices for materials.

Alternatively, the transistor may contain silicon in the channel formation region. Examples of silicon include low temperature poly-silicon (LTPS), amorphous silicon, microcrystalline silicon, and a single-crystal silicon.

Then, a protective layer is formed over the functional layer 25. The protective layer is a layer positioned on the outermost surface of the display device. The protective layer preferably has a high visible-light-transmitting property. The protective layer preferably includes an organic insulating film because it is possible to prevent the surface of the display device from being damaged or cracked.

FIG. 1(F) illustrates an example in which a substrate 75a is bonded onto the functional layer 25 with the use of an adhesive layer 75b.

As the adhesive layer 75b, any of a variety of curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. For the substrate 75a, any of a variety of materials such as glass, quartz, a resin, a metal, an alloy, and a semiconductor, each of which is thin enough to be flexible, may also be used.

Next, the functional layer 25 is separated from the formation substrate 10. The separation occurs inside the metal compound layer 22 (FIG. 1(G1)).

Figure 2E:
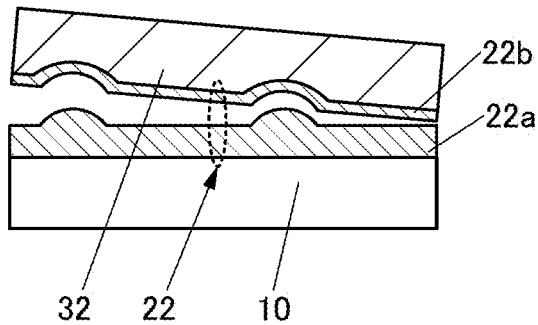

As illustrated in FIG. 2(E), the separation occurs at the interface between the two (upper and lower) layers included in the metal compound layer 22 or in the vicinity thereof. In the case where the interface is uneven, for example, separation may occur along the unevenness.

After the separation, a metal compound layer 22a remains on the formation substrate 10 side, and a metal compound layer 22b remains on the resin layer 32 side (see FIG. 1(G1) and FIG. 2(E)).

The functional layer 25 can be separated from the formation substrate 10 by applying a perpendicularly-pulling force to the functional layer 25, for example. Specifically, part of the top surface of the substrate 75a is suctioned and pulled up, whereby the functional layer 25 can be separated from the formation substrate 10.

Here, separation can be facilitated in such a manner that a liquid containing water such as water or an aqueous solution is added to the separation interface so that the liquid penetrates into the separation interface. Furthermore, static electricity generated during the separation can be prevented from adversely affecting the functional element such as a transistor (e.g., from breaking a semiconductor element). FIG. 1(G2) illustrates an example in which a liquid is fed to the separation interface with a liquid feeding mechanism 26. Furthermore, static electricity on the surface exposed by the separation may be removed with an ionizer or the like. In the case where a liquid is fed to the separation interface, the exposed surface may be dried after the separation.

As the liquid to be fed, water (preferably pure water), a neutral, alkaline, or acidic aqueous solution, and an aqueous solution in which a salt is dissolved can be given. In addition, ethanol, acetone, and the like can be given. Furthermore, a variety of organic solvents may also be used.

A separation starting point may be formed by separating part of the metal compound layer 22 from the formation substrate 10. The separation starting point may be formed by inserting a sharp instrument such as a knife between the formation substrate 10 and the metal compound layer 22, for example. Alternatively, the separation starting point may be formed by cutting the metal compound layer 22 from the substrate 75a side with a sharp instrument. Alternatively, the separation starting point may be formed by a method using a laser, such as a laser ablation method.

As described above, in the separation method of this embodiment, plasma treatment using a gas containing fluorine and then plasma treatment using a gas containing oxygen are performed on the metal layer 20, whereby the metal compound layer 22 including a region high in fluorine is formed. Then, the metal compound layer 22 is heated, so that a portion with low adhesion is formed in the metal compound layer 22. Thus, the functional layer 25 formed over the metal compound layer 22 can be separated from the formation substrate 10 without a step of irradiating a wide area of the formation substrate 10 with laser light.

Fabrication Method Example 1

Next, fabrication method examples of the display device of this embodiment will be described. Some parts of the method that are similar to the above-described separation method will not be described.

Figure 3A:
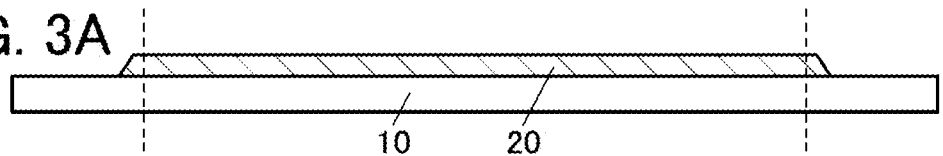
FIGS. 3A-3F are cross-sectional views illustrating an example of a fabrication method of a display device.

First, an island-shaped metal layer 20 is formed over the formation substrate 10 (FIG. 3(A)). For the metal layer 20, the description of the above separation method can be referred to.

Figure 3B:
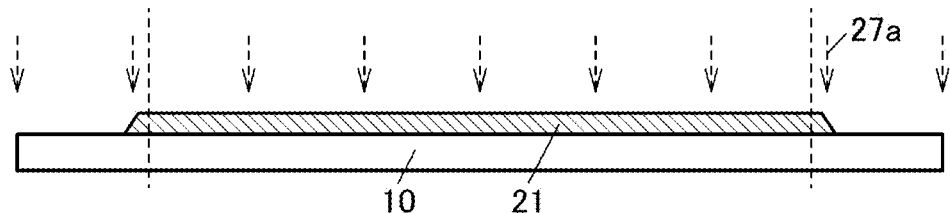

Next, fluorine is supplied the metal layer 20. In this embodiment, fluorine is supplied to the metal layer 20 by performing the first plasma treatment using a gas containing fluorine (FIG. 3(B)). In FIG. 3(B), the metal layer 20 on which the first plasma treatment has been performed is referred to as the metal compound layer 21.

Figure 3C:
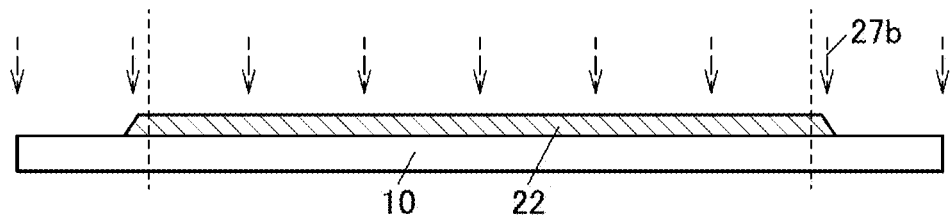
Figure 3D:
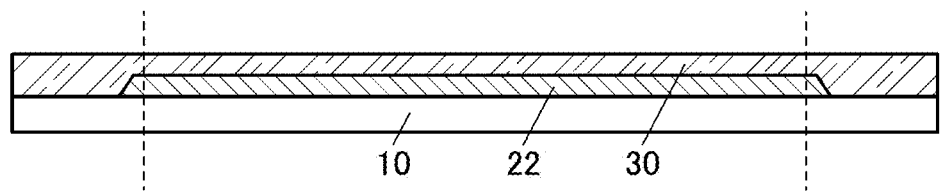

Next, oxygen is supplied to the metal layer 20 to which fluorine has been supplied (metal compound layer 21). In this embodiment, the second plasma treatment using a gas containing oxygen is performed, whereby the metal compound layer 21 is oxidized (FIG. 3(C)). In FIG. 3(C), the metal layer 20 (metal compound layer 21) to which the second plasma treatment has been performed is referred to as the metal compound layer 22.

Next, the first layer 30 is preferably formed over the metal compound layer 22 (FIG. 3 (D)). For the first layer 30, the description of the above separation method can be referred to.

In this embodiment, the first layer 30 is formed using a photosensitive and thermosetting material.

Figure 3E:
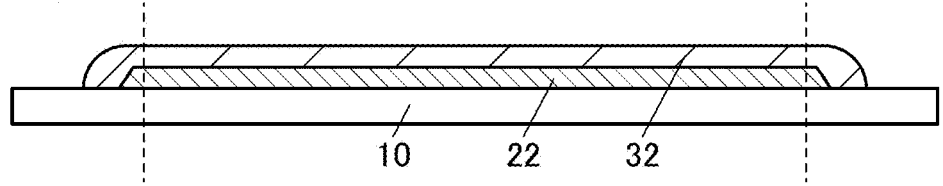

Pre-baking treatment is performed after the formation of the first layer 30, and then light exposure is performed using a photomask. Then, development treatment is performed, whereby an unnecessary portion can be removed. Subsequently, heat treatment is performed on the first layer 30 that has been processed into a desired shape, so that the resin layer 32 is formed (FIG. 3(E)). FIG. 3(E) illustrates an example in which the resin layer 32 having an island-like shape is formed.

As illustrated in FIG. 3(E), the resin layer 32 preferably covers an end portion of the metal compound layer 22.

Note that the shape of the resin layer 32 is not limited to a single island and may be a shape including a plurality of islands or a shape having an opening, for example. In addition, an uneven shape may be formed on the surface of the resin layer 32 by an exposure technique using a half-tone mask or a gray-tone mask, a multiple exposure technique, or the like.

The resin layer 32 with a desired shape can be formed in such a manner that a mask such as a resist mask or a hard mask is formed over the first layer 30 or the resin layer 32 and etching is performed. This method is particularly suitable for the case in which a non-photosensitive material is used.

For example, an inorganic film is formed over the resin layer 32, and a resist mask is formed over the inorganic film. After the inorganic film is etched with the use of the resist mask, the resin layer 32 can be etched using the inorganic film as a hard mask.

As an inorganic film that can be used as the hard mask, a variety of inorganic insulating films, metal films and alloy films that can be used for a conductive layer, and the like can be given.

It is preferable if the mask with an extremely small thickness is formed and the mask can be removed concurrently with the etching, in which case a step of removing the mask can be eliminated.

For details of the heat treatment, the description of the heat treatment in the above separation method can be referred to.

Figure 3F:
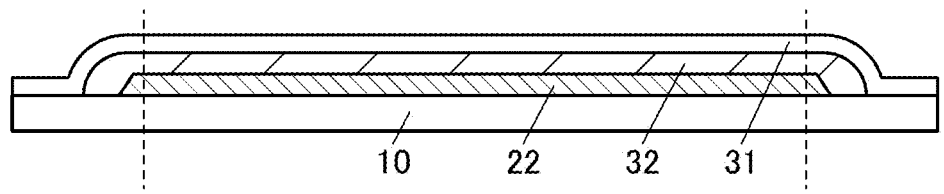

Next, an insulating layer 31 is formed over the resin layer 32 (FIG. 3(F)). The insulating layer 31 is formed to cover the end portion of the resin layer 32. Over the formation substrate 10, there is a portion where the resin layer 32 is not provided. Thus, part of the insulating layer 31 is formed over and in contact with the formation substrate 10. In contrast, the end portion of the metal compound layer 22 is positioned on an inner side than the end portion of the resin layer 32; thus, the insulating layer 31 is not in contact with the metal compound layer 22.

Low adhesion between the metal compound layer 22 and the insulating layer 31 causes peeling during the fabrication process of the device, which leads to reduction in yield. Film separation is observed in some cases when a titanium oxide film is used as the metal compound layer 22 and an inorganic insulating film such as a silicon oxide film or a silicon oxynitride film is used as the insulating layer 31, for example.

Thus, the resin layer 32 is preferably provided so as to cover the end portion of the metal compound layer 22 as illustrated in FIG. 3(E). The portion where the metal compound layer 22 is not covered with the resin layer 32 is reduced or even eliminated, whereby the portion where the metal compound layer 22 and the insulating layer 31 are in contact with each other can be reduced or even eliminated. Thus, a portion with low adhesion can be prevented from being formed in the stacked structure, so that film separation can be prevented. As a result, yield in the fabrication process of the device can be improved. Furthermore, there is no need to consider the adhesion between the metal compound layer 22 and the insulating layer 31, and the like; thus, the range of choices for the materials to be used for the metal compound layer 22 and the insulating layer 31 is widened.

The insulating layer 31 is formed at a temperature lower than or equal to the upper temperature limit of the resin layer 32. The insulating layer 30 is preferably formed at a temperature lower than the temperature of the heat treatment performed on the first layer 30.

The insulating layer 31 can be used as a barrier layer that prevents diffusion of impurities contained in the resin layer 32 into a transistor and a display element formed later. For example, the insulating layer 31 preferably prevents moisture and the like contained in the resin layer 32 from diffusing into the transistor and the display element when the resin layer 32 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used. It is particularly preferable that a silicon nitride film be formed over the resin layer 32 and a silicon oxide film be formed over the silicon nitride film.

An inorganic insulating film is preferably formed at high temperatures because the film can have higher density and a higher barrier property as the film formation temperature is higher.

The substrate temperature during the formation of the insulating layer 31 is preferably higher than or equal to room temperature (25° C.) and lower than or equal to 350° C., further preferably 100° C. to 300° C. inclusive.

Figure 4A:
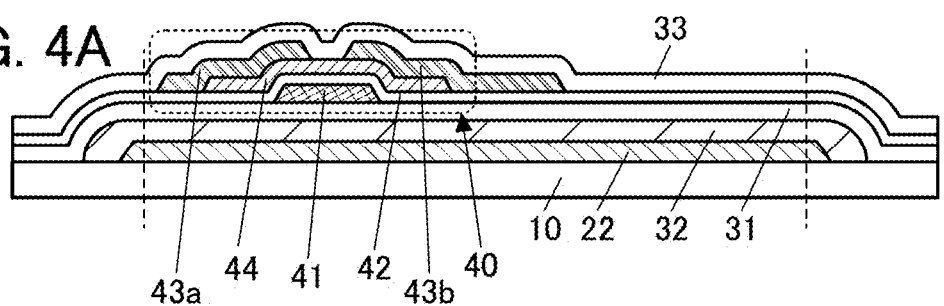
FIGS. 4A-4B are cross-sectional views illustrating an example of a fabrication method of a display device.

Next, a transistor 40 is formed over the insulating layer 31 (FIG. 4(A)).

There is no particular limitation on the structure of the transistor in the display device. For example, a planar transistor, a staggered transistor, or an inverted staggered transistor may be used. The transistor structure may be a top-gate structure or a bottom-gate structure. Gate electrodes may be provided above and below a channel.

In this example, a transistor with a bottom-gate structure including a metal oxide layer 44 is formed as the transistor 40. The metal oxide layer 44 can serve as a semiconductor layer of the transistor 40. The metal oxide can serve as an oxide semiconductor.

In this embodiment, an oxide semiconductor is used as a semiconductor of the transistor. Using a semiconductor material having a wider band gap and a lower carrier density than silicon is preferable because the off-state current of a transistor can be reduced.

The transistor 40 is formed at a temperature lower than or equal to the upper temperature limit of the resin layer 32. The transistor 40 is preferably formed at a temperature lower than the temperature of the heat treatment performed on the first layer 30.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature during the formation of the conductive film is preferably higher than or equal to room temperature and lower than or equal to 350° C., further preferably higher than or equal to room temperature and lower than or equal to 300° C.

The conductive layer included in the display device can formed with a single-layer structure or a stacked-layer structure, using one or more of metals such as aluminum, titanium, chromium, nickel, copper, yttrium, zirconium, molybdenum, silver, tantalum, and tungsten and alloys containing at least one of these metals as its main component. Alternatively, light-transmitting conductive materials such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, and ITO containing silicon may be used. At least one of the following may also be used: a semiconductor such as an oxide semiconductor or polycrystalline silicon whose resistance is lowered by adding an impurity element, for example, and silicide such as nickel silicide. A film containing graphene may be used as well. A film containing graphene can be formed, for example, by reducing a film containing graphene oxide. A semiconductor such as an oxide semiconductor containing an impurity element may be used as well. Alternatively, the conductive layer may be formed using at least one of the following: a conductive paste of silver, carbon, copper, and the like, and a conductive polymer such as a polythiophene. A conductive paste is preferable because it is inexpensive. A conductive polymer is preferable because it is easily applied.

Next, an insulating layer 42 is formed. For the insulating layer 42, the inorganic insulating films that can be used for the insulating layer 31 can be used.

Then, the metal oxide layer 44 is formed. The metal oxide layer 44 can be formed in the following manner: a metal oxide film is formed, a resist mask is formed, the metal oxide film is etched, and the resist mask is removed.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using one or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow ratio of oxygen (the partial pressure of oxygen) at the time of forming the metal oxide film is preferably 0% to 30% inclusive, further preferably 5% to 30% inclusive, still further preferably 7% to 15% inclusive.

The metal oxide film preferably contains at least indium or zinc. Containing indium and zinc is particularly preferable.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. A PLD method, a PECVD method, a thermal CVD method, an ALD method, a vacuum evaporation method, or the like may also be used.

Next, a conductive layer 43a and a conductive layer 43b are formed. The conductive layer 43a and the conductive layer 43b can be formed in the following manner: a conductive film is formed, a resist mask is formed, the conductive film is etched, and the resist mask is removed. The conductive layer 43a and the conductive layer 43b are each connected to the metal oxide layer 44.

Note that during the processing of the conductive layer 43a and the conductive layer 43b, part of the metal oxide layer 44 not covered by the resist mask might be etched to be thin.

The substrate temperature during the formation of the conductive film is preferably higher than or equal to room temperature and lower than or equal to 350° C., further preferably higher than or equal to room temperature and lower than or equal to 300° C.

In the above manner, the transistor 40 can be fabricated (FIG. 4(A)). In the transistor 40, part of the conductive layer 41 functions as a gate, part of the insulating layer 42 functions as a gate insulating layer, and the conductive layer 43a and the conductive layer 43b each function as a source or a drain.

Next, an insulating layer 33 covering the transistor 40 is formed (FIG. 4(A)). The insulating layer 33 can be formed by a method similar to that of the insulating layer 31.

It is preferable to use an oxide insulating film, such as a silicon oxide film or a silicon oxynitride film formed in an oxygen-containing atmosphere, for the insulating layer 33. An insulating film with low oxygen diffusibility and oxygen permeability, such as a silicon nitride film, is preferably stacked over the silicon oxide film or the silicon oxynitride film. An oxide insulating film formed in an oxygen-containing atmosphere can easily release a large amount of oxygen by heating. When heat treatment is performed in a state where such an oxide insulating film that releases oxygen and such an insulating film with low oxygen diffusibility and oxygen permeability are stacked, oxygen can be supplied to the metal oxide layer 44. As a result, oxygen vacancies in the metal oxide layer 44 and defects at the interface between the metal oxide layer 44 and the insulating layer 33 can be repaired, leading to a reduction in defect levels. Accordingly, a display device with very high reliability can be fabricated.

Through the above steps, the insulating layer 31, the transistor 40, and the insulating layer 33 can be formed over the resin layer 32 (FIG. 4(A)). If the transistor 40 is separated from the formation substrate 10 at this stage by using a method described later, a device including no display element can be fabricated. By forming the transistor 40 or forming a capacitor, a resistor, a wiring, and the like in addition to the transistor 40, for example, a semiconductor device can be fabricated.

Figure 4B:
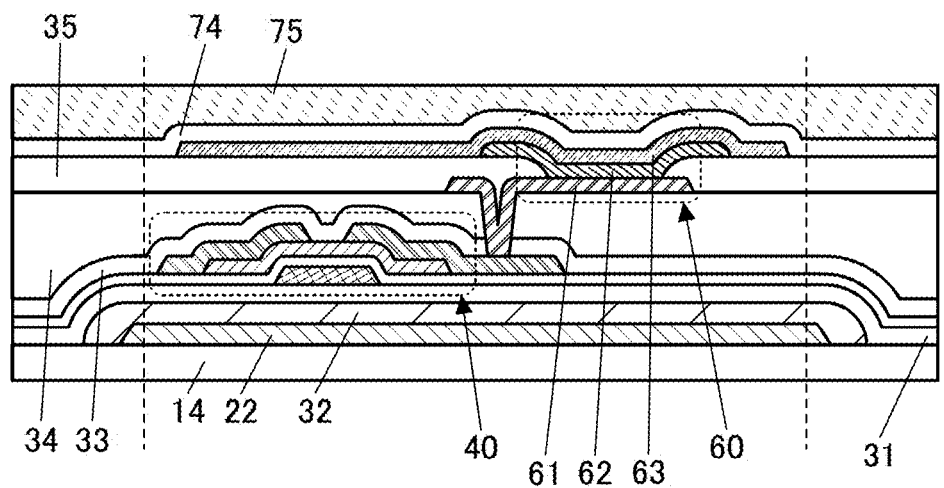

Then, an insulating layer 34 is formed over the insulating layer 33 (FIG. 4(B)). The insulating layer 34 is a layer having the surface on which a display element is to be formed later, and thus preferably functions as a planarization layer. For the insulating layer 34, at least one of the organic insulating films and inorganic insulating films that can be used for the insulating layer 31 can be used.

The insulating layer 34 is formed at a temperature lower than or equal to the upper temperature limit of the resin layer 32. The insulating layer 34 is preferably formed at a temperature lower than the temperature of the heat treatment performed on the first layer 30.

In the case where an organic insulating film is used for the insulating layer 34, it is preferable that the temperature applied to the resin layer 32 in forming the insulating layer 34 be higher than or equal to room temperature and lower than or equal to 350° C., further preferably higher than or equal to room temperature and lower than or equal to 300° C.

In the case where an inorganic insulating film is used as the insulating layer 34, the substrate temperature during the film formation is preferably higher than or equal to room temperature and lower than or equal to 350° C., further preferably 100° C. to 300° C. inclusive.

Next, an opening reaching the conductive layer 43b is formed in the insulating layer 34 and the insulating layer 33.

After that, a conductive layer 61 is formed. Part of the conductive layer 61 functions as a pixel electrode of a light-emitting element 60. The conductive layer 61 can be formed in the following manner: a conductive film is formed, a resist mask is formed, the conductive film is etched, and then the resist mask is removed.

The conductive layer 61 is formed at a temperature lower than or equal to the upper temperature limit of the resin layer 32. The conductive layer 61 is preferably formed at a temperature lower than the temperature of the heat treatment performed on the first layer 30.

The substrate temperature during the formation of the conductive film is preferably higher than or equal to room temperature and lower than or equal to 350° C., further preferably higher than or equal to room temperature and lower than or equal to 300° C.

Next, an insulating layer 35 covering the end portion of the conductive layer 61 is formed. For the insulating layer 35, at least one of the organic insulating films and inorganic insulating films that can be used for the insulating layer 31 can be used.

The insulating layer 35 is formed at a temperature lower than or equal to the upper temperature limit of the resin layer 32. The insulating layer 35 is preferably formed at a temperature lower than the temperature of the heat treatment performed on the first layer 30.

In the case where an organic insulating film is used for the insulating layer 35, it is preferable that the temperature applied to the resin layer 32 in forming the insulating layer 35 be higher than or equal to room temperature and lower than or equal to 350° C., further preferably higher than or equal to room temperature and lower than or equal to 300° C.

In the case where an inorganic insulating film is used as the insulating layer 35, the substrate temperature during the film formation is preferably higher than or equal to room temperature and lower than or equal to 350° C., further preferably 100° C. to 300° C. inclusive.

Then, an EL layer 62 and a conductive layer 63 are formed. Part of the conductive layer 63 functions as a common electrode of the light-emitting element 60.

The EL layer 62 can be formed by an evaporation method, a coating method, a printing method, a discharge method, or the like. In the case where the EL layer 62 is formed for each individual pixel, it can be formed by an evaporation method using a shadow mask such as a metal mask, an ink-jet method, or the like. Not requiring the use of a mask, a printing method is preferable because it imposes no limitation on the substrate size and facilitates the use of larger substrates, as compared with an evaporation method. In the case where the EL layer 62 is not formed for each individual pixel, an evaporation method not using a metal mask can be used.

Either a low molecular compound or a high molecular compound can be used for the EL layer 62, and an inorganic compound may also be contained.

The conductive layer 63 can be formed by an evaporation method, a sputtering method, or the like.

The conductive layer 63 is formed at a temperature that is lower than or equal to the upper temperature limit of the resin layer 32 and lower than or equal to the upper temperature limit of the EL layer 62. The conductive layer 63 is preferably formed at a temperature lower than the temperature of the heat treatment performed on the first layer 30.

In the above manner, the light-emitting element 60 can be formed (FIG. 4(B)). The light-emitting element 60 has a structure where the conductive layer 61 part of which functions as the pixel electrode, the EL layer 62, and the conductive layer 63 part of which functions as the common electrode are stacked.

Although an example where a top-emission light-emitting element is formed as the light-emitting element 60 is described here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which no light is extracted.

Next, an insulating layer 74 is formed so as to cover the conductive layer 63 (FIG. 4(B)). The insulating layer 74 functions as a protective layer that prevents diffusion of impurities such as water into the light-emitting element 60. The light-emitting element 60 is sealed with the insulating layer 74. After the conductive layer 63 is formed, the insulating layer 74 is preferably formed without exposure to the air.

The insulating layer 74 is formed at a temperature that is lower than or equal to the upper temperature limit of the resin layer 32 and lower than or equal to the upper temperature limit of the light-emitting element 60. The insulating layer 74 is preferably formed at a temperature lower than the temperature of the heat treatment performed on the first layer 30.

The insulating layer 74 preferably has a structure including an inorganic insulating film with a high barrier property that can be used for the above-mentioned insulating layer 31, for example. A stack including an inorganic insulating film and an organic insulating film can also be used.

The insulating layer 74 can be formed by an ALD method, a sputtering method, or the like. An ALD method and a sputtering method are preferable because a film can be formed at low temperatures. The use of an ALD method is preferable because the coverage with the insulating layer 74 is improved.

Then, a protective layer 75 is formed over the insulating layer 74 (FIG. 4(B)). The adhesive layer 75b and the substrate 75a may be used as the protective layer 75 as illustrated in FIG. 1(F).

Figure 5A:
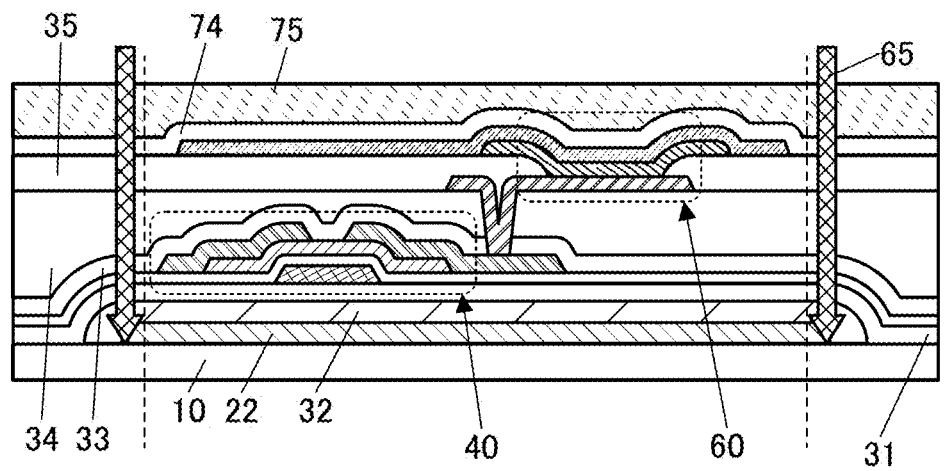
FIGS. 5A-5C are a cross-sectional view and top views illustrating examples of a fabrication method of a display device.
Figure 5B:
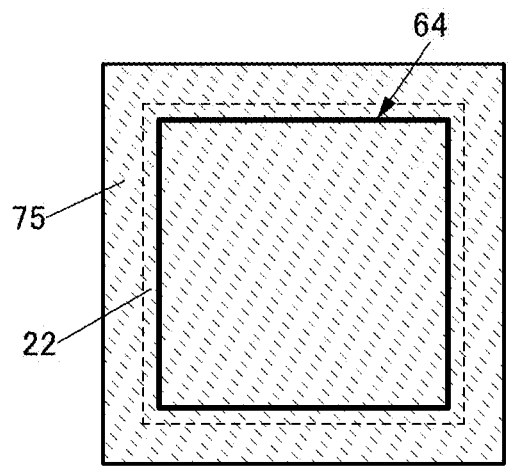
Figure 5C:
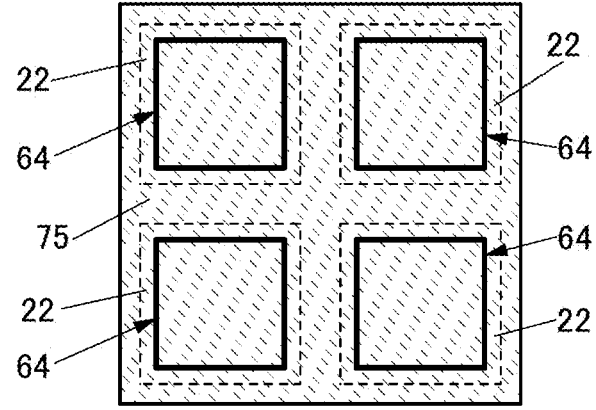

Next, a separation starting point is formed in the metal compound layer 22 (FIGS. 5(A) to 5(C)).

For example, a sharp instrument 65, e.g., a knife, is inserted from the protective layer 75 side into a portion located on an inner side than the end portion of the metal compound layer 22 to make a cut 64 in a frame-like shape.

Alternatively, the metal compound layer 22 may be irradiated with laser light in a frame-like shape.

In the case where a plurality of display devices are formed using one formation substrate (a multiple panel method), the plurality of display devices can be formed using one metal compound layer 22. For example, the plurality of display devices are provided inside the cut 64 shown in FIG. 5(B). In that case, the plurality of display devices can be separated from the formation substrate at a time.

Alternatively, a plurality of metal compound layers 22 may be used, and the metal compound layers 22 may be formed separately for different display devices. FIG. 6(C) illustrates an example in which four metal compound layers 22 are formed over a formation substrate. The cut 64 is made in a frame-like shape in each of the four metal compound layers 22, whereby the display devices can be separated from the formation substrate at different timings.

In the fabrication method example 1, the top surface of the formation substrate 10 has a portion that is in contact with the metal compound layer 22 and a portion that is in contact with the insulating layer 31. This can prevent the metal compound layer 22 from being accidentally separated. For example, the metal compound layer 22 can be prevented from separating from the formation substrate 10 during transfer of the substrate 10 or the like. Then, the formation of the separation starting point can trigger separation in the metal compound layer 22 at desired timing, whereby the functional layer including the transistor 40 can be separated from the formation substrate 10. Thus, the timing of the separation can be controlled and the force required for the separation is small. This can increase the yield of the separation step and the fabrication process of the display device.

Figure 6A:
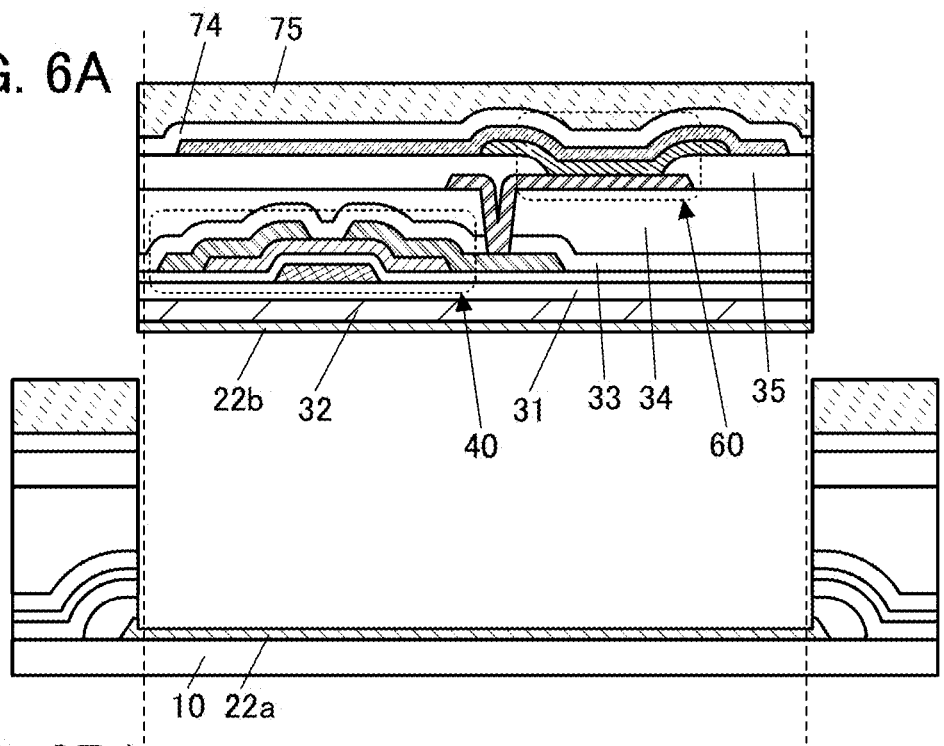

Next, the functional layer including the transistor 40 is separated from the formation substrate 10 (FIG. 6A). FIG. 6(A) illustrates an example in which separation occurs in the metal compound layer 22, and the metal compound layer 22a remains on the formation substrate 10 side and the metal compound layer 22b remains on the resin layer 32 side.

Figure 6A:
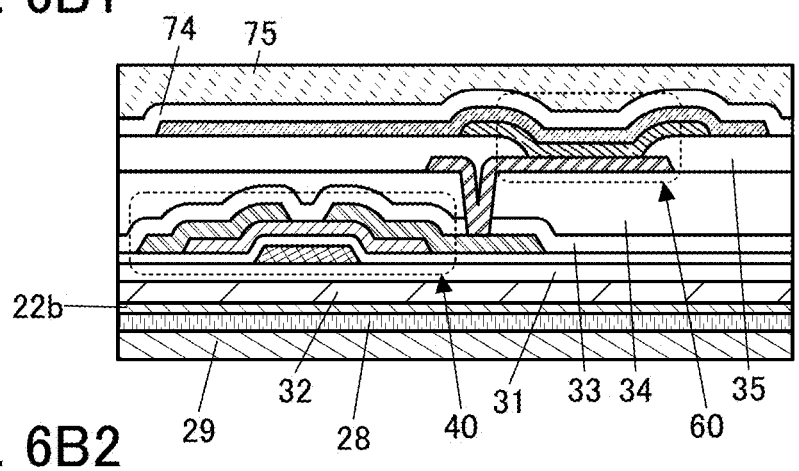
Figure 6A:
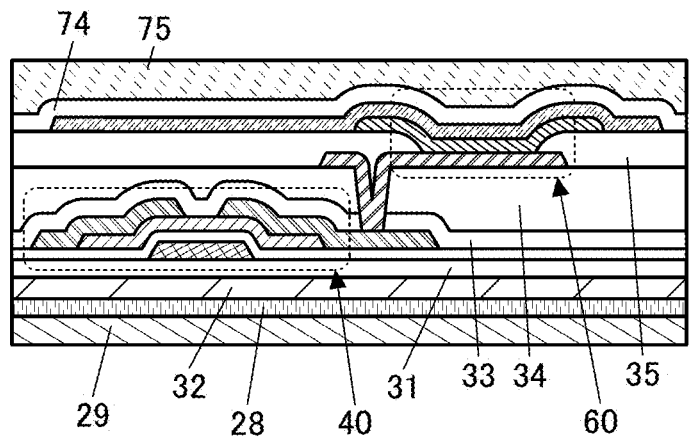

After that, a substrate 29 is bonded to the exposed metal compound layer 22b with an adhesive layer 28 (FIG. 6(B1)).

Note that each of the metal compound layer 22b and the resin layer 32 separated from the formation substrate 10 may be removed or left in a completed display device.

In the case where the metal compound layer 22b or the resin layer 32 left in the display device causes defects in the display device characteristics, the metal compound layer 22b or the resin layer 32 is preferably removed.

By removing the metal compound layer 22b and the resin layer 32, the weight and thickness of the display device can be reduced, and the flexibility of the display device can be increased.

When the metal compound layer 22b has high conductivity, for example, characteristics of the transistor might be shifted.

In addition, in the case where the light from the light-emitting element 60 is extracted through the metal compound layer and the resin layer and the light-transmitting properties of the metal compound layer and the resin layer are low, a problem such as a reduced light extraction efficiency, a change in the color of the light before and after the extraction, or reduced display quality might occur.

In such a case, the removal of the metal compound layer or the resin layer can improve the characteristics of the display device.

FIG. 6(B2) illustrates an example in which the metal compound layer 22b is removed and the substrate 29 is bonded to the resin layer 32 with the adhesive layer 28.

The method for removing the metal compound layer 22b is not particularly limited, and examples thereof include a method in which the metal compound layer 22b is immersed in an ammonia hydrogen peroxide solution, a method in which the metal compound layer 22b is wiped off with ethanol, acetone, or the like, and etching.

The method for removing the resin layer 32 is not particularly limited, and examples thereof include wet etching, dry etching, and ashing. In particular, removing the resin layer 32 by ashing using oxygen plasma is preferable.

In the case where the metal compound layer 22b or the resin layer 32 is left, the removal steps can be eliminated, so that the fabrication process of the display device can be simplified.

With the use of the separation method of this embodiment, the transistor 40, the light-emitting element 60, and the like that are fabricated over the formation substrate 10 can be separated from the formation substrate 10 and transferred onto the substrate 29.

The substrate 29 can function as a supporting substrate of the display device. A film is preferably used as the substrate 29; particularly, the use of a resin film is preferable. In that case, the display device can be reduced in weight and thickness. The display device using a film substrate is less prone to breakage than display devices using glass, metal, or the like. The flexibility of the display device can also be improved.

For the adhesive layer 28, the material that can be used for the adhesive layer 75b can be used. For the substrate 29, the material that can be used for the substrate 75a can be used.

In the fabrication method example 1, plasma treatment using a gas containing fluorine and plasma treatment using a gas containing oxygen are performed on the metal layer 20, whereby the metal compound layer 22 including a region high in fluorine is formed. Then, the metal compound layer 22 is heated, so that a portion with low adhesion is formed in the metal compound layer 22. Thus, the transistor 40 and the like formed over the metal compound layer 22 can be separated from the formation substrate 10 without a step of irradiating a wide area of the formation substrate 10 with laser light.

In the fabrication method example 1, the resin layer 32 is provided to cover the metal compound layer 22, whereby a portion where the metal compound layer 22 and the insulating layer 31 are in contact with each other is reduced and film separation is inhibited. Then, the formation of the separation starting point enables separation in the metal compound layer 22 to be triggered at desired timing. Since the timing of the separation can be controlled and the force required for the separation is small, the yield of the separation step and the fabrication process of the display device can be improved.

[Structure Example 1 of Display Device]

Figure 7A:
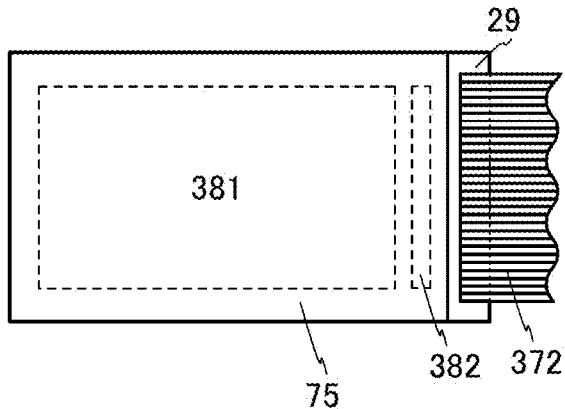
FIGS. 7A-7C are a top view and cross-sectional views illustrating examples of a display device.
Figure 7B:
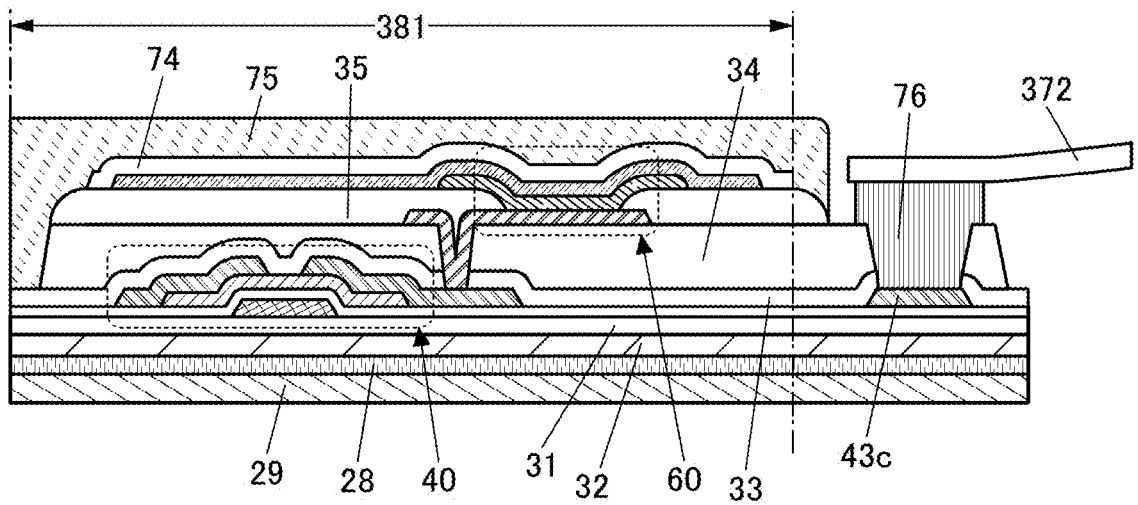
Figure 7C:
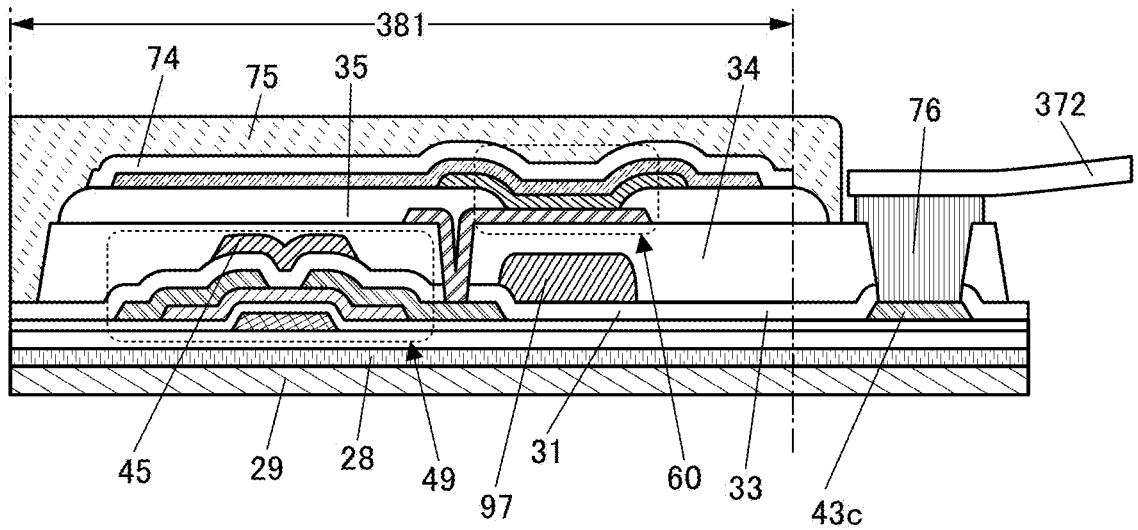

FIG. 7(A) is a top view of a display device 15A. FIGS. 7(B) and 7(C) are each an example of a cross-sectional view of a display portion 381 of the display device 15A and a cross-sectional view of a portion for connection to an FPC 372.

The display device 15A can be fabricated with the use of the above fabrication method example 1. The display device 15A can be held in a bent state and can be bent repeatedly, for example.

The display device 15A includes the protective layer 75 and the substrate 29. The protective layer 75 side is the display surface side of the display device. The display device 15A includes the display portion 381 and a driver circuit portion 382. The FPC 372 is attached to the display device 15A.

A conductive layer 43c and the FPC 372 are electrically connected through a connector 76 (FIGS. 7(B) and 7(C)). The conductive layer 43c can be formed using the same material and the same step as those of a source and a drain of the transistor.

As the connector 76, any of a variety of anisotropic conductive films (ACF), anisotropic conductive pastes (ACP), and the like can be used.

The display device illustrated in FIG. 7(C) is different from the structure in FIG. 7(B) in including not the transistor 40 but a transistor 49, not including the resin layer 32, and including a coloring layer 97 over the insulating layer 33. In the case where the light-emitting element 60 of a bottom-emission type is used, the coloring layer 97 may be included closer to the substrate 29 than the light-emitting element 60 is. In the case where the resin layer 32 is colored, the display quality of the display device can be improved by not including the resin layer 32 left in the display device.

The transistor 49 illustrated in FIG. 7(C) includes a conductive layer 45 serving as a gate, as well as the components of the transistor 40 illustrated in FIG. 7(B).

The transistor 49 has a structure in which the semiconductor layer where a channel is formed is provided between two gates. Such a structure enables the control of the threshold voltage of the transistor. The two gates may be connected to each other and supplied with the same signal to operate the transistor. Such a transistor can have a higher field-effect mobility and thus have a higher on-state current than other transistors. Consequently, a circuit capable of high-speed operation can be fabricated. Furthermore, the area occupied by a circuit portion can be reduced. The use of the transistor having a high on-state current can reduce signal delay in wirings and can suppress display unevenness even if the number of wirings is increased when a display device is increased in size or resolution.

Alternatively, by supplying a potential for controlling the threshold voltage to one of the two gates and a potential for driving to the other, the threshold voltage of the transistor can be controlled.

Fabrication Method Example 2

Figure 8A:
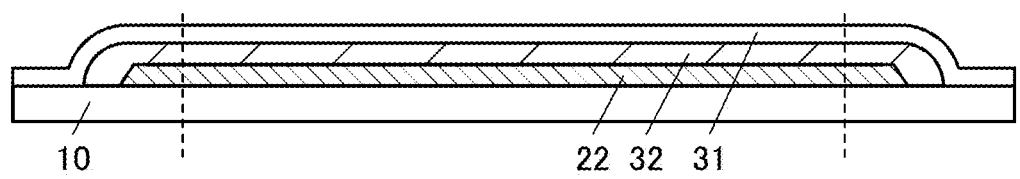
FIGS. 8A-8C are cross-sectional views illustrating an example of a fabrication method of a display device.

First, the components from the metal compound layer 22 to the insulating layer 31 are formed over the formation substrate 10 as in the above separation method (FIG. 8(A)). As illustrated in FIG. 8(A), the metal compound layer 22 is covered with the resin layer 32. Thus, the portion where the metal compound layer 22 and the insulating layer 31 are in contact with each other can be reduced or even eliminated. Thus, film separation during the fabrication process of the display device can be prevented.

Figure 8B:
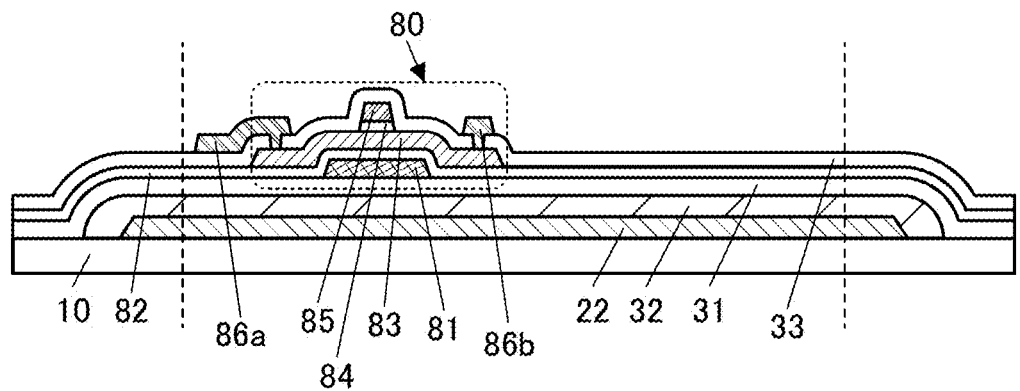

Next, a transistor 80 is formed over the insulating layer 31 (FIG. 8(B)).

In this example, a transistor including a metal oxide layer 83 and two gates is fabricated as the transistor 80.

The transistor 80 is formed at a temperature lower than or equal to the upper temperature limit of the resin layer 32. The transistor 80 is preferably formed at a temperature lower than the temperature of the heat treatment performed on the first layer 30.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the inorganic insulating film that can be used for the insulating layer 31 can be used.

Then, the metal oxide layer 83 is formed. The metal oxide layer 83 can be formed in the following manner: a metal oxide film is formed, a resist mask is formed, the metal oxide film is etched, and the resist mask is removed. For the metal oxide layer 83, the materials that can be used for the metal oxide layer 44 can be used.

Then, an insulating layer 84 and a conductive layer 85 are formed. For the insulating layer 84, the inorganic insulating film that can be used for the insulating layer 31 can be used. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the metal oxide layer 83, the insulating layer 84, and the conductive layer 85 is formed. The insulating layer 33 can be formed using a method similar to that of the insulating layer 31.

The insulating layer 33 preferably contains hydrogen. The hydrogen contained in the insulating layer 33 is diffused to the metal oxide layer 83 in contact with the insulating layer 33, so that part of the metal oxide layer 83 has reduced resistance. Since part of the metal oxide layer 83 serves as a low-resistance region, the on-state current and the field-effect mobility of the transistor 80 can be increased.

Next, openings reaching the metal oxide layer 83 are formed in the insulating layer 33.

Then, a conductive layer 86a and a conductive layer 86b are formed. The conductive layer 86a and the conductive layer 86b can be formed in the following manner: a conductive film is formed, a resist mask is formed, the conductive film is etched, and the resist mask is removed. The conductive layer 86a and the conductive layer 86b are each electrically connected to the metal oxide layer 83 through the openings formed in the insulating layer 33.

In the above manner, the transistor 80 can be fabricated (FIG. 8B)). In the transistor 80, part of the conductive layer 81 serves as a gate, part of the insulating layer 82 serves as a gate insulating layer, part of the insulating layer 84 serves as a gate insulating layer, and part of the conductive layer 85 serves as a gate. The metal oxide layer 83 includes a channel formation region and a low-resistance region. The channel formation region overlaps with the conductive layer 85 with the insulating layer 84 provided therebetween. The low-resistance region has a portion connected to the conductive layer 86a and a portion connected to the conductive layer 86b.

Figure 8C:
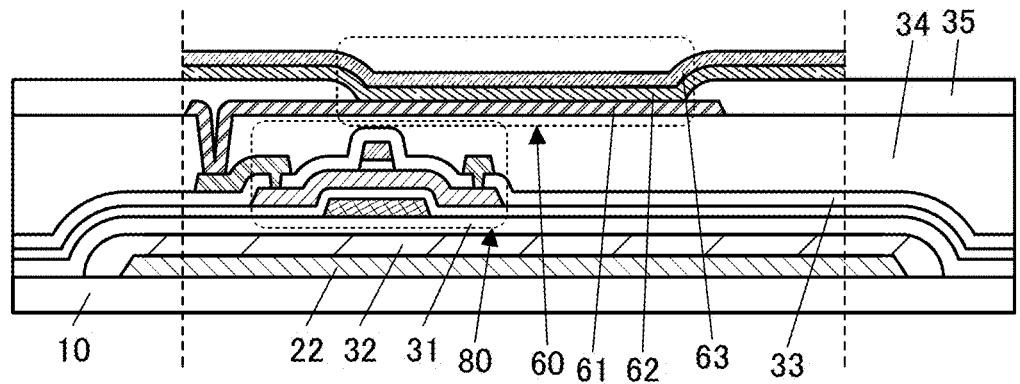

Next, the components from the insulating layer 34 to the light-emitting element 60 are formed over the insulating layer 33 (FIG. 8(C)). For the steps, the fabrication method example 1 can be referred to.

Figure 9A:
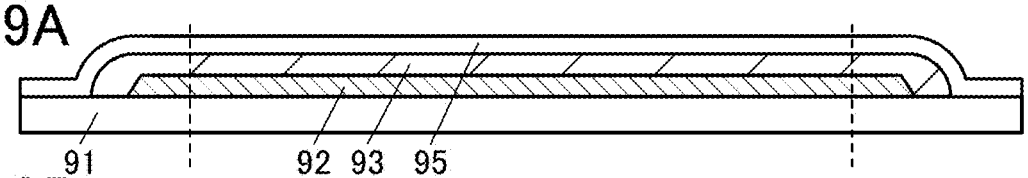
Figure 9B:
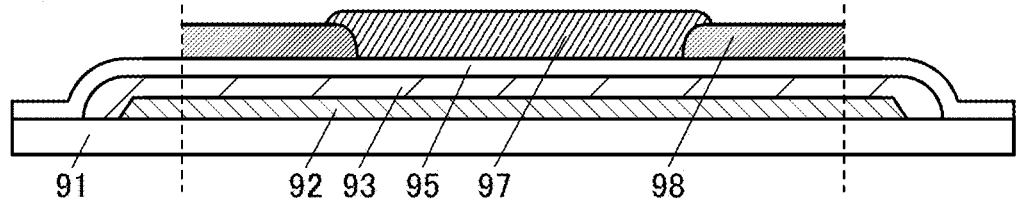
Figure 9B:
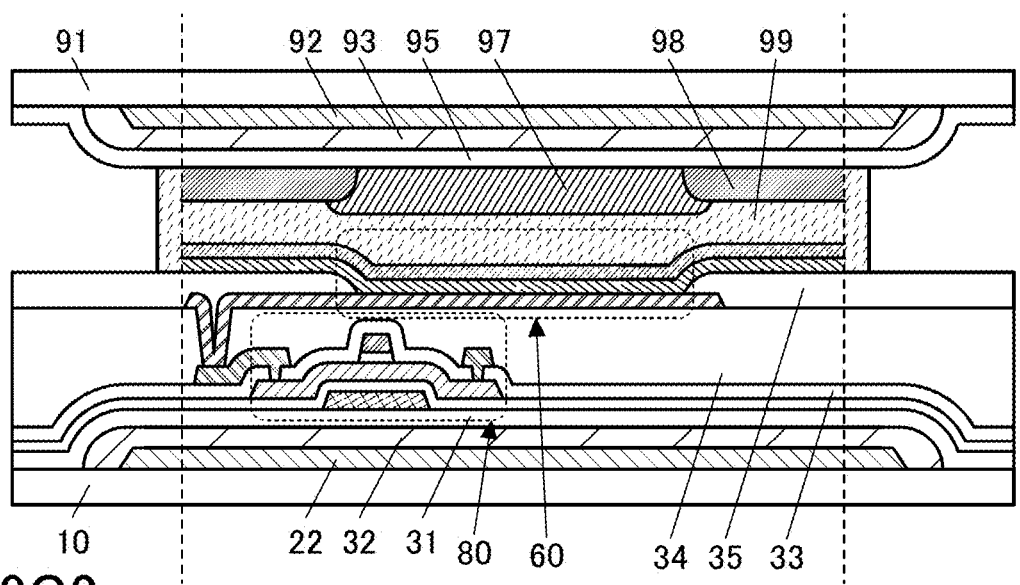
Figure 9B:
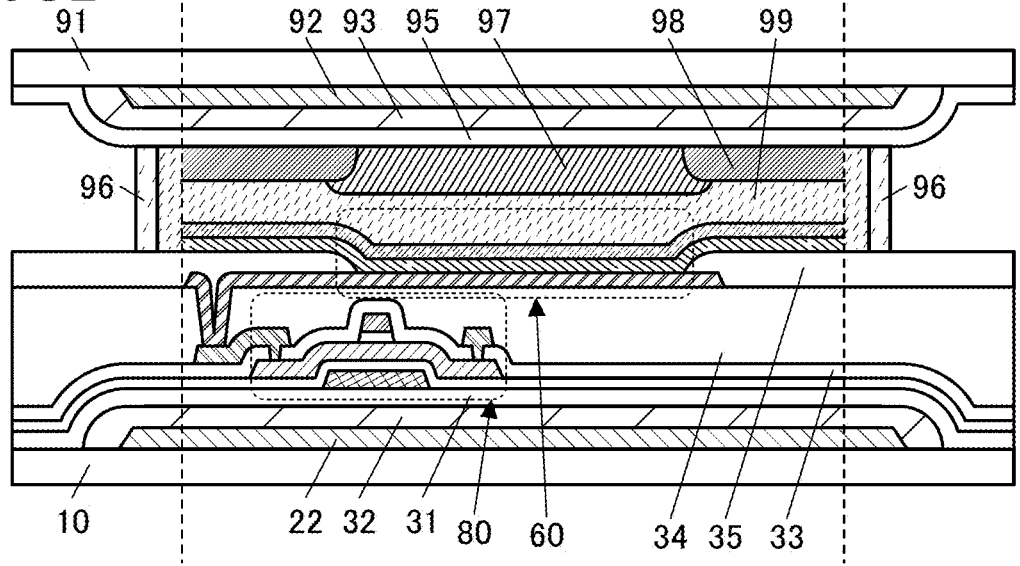

Furthermore, the steps in FIGS. 9(A) and 9(B) are taken independently of steps in FIGS. 8(A) to 8(C). First, in a manner similar to that of the step of forming the metal compound layer 22 over the formation substrate 10, a metal layer is formed over a formation substrate 91 and two kinds of plasma treatment are performed on the metal layer, whereby a metal compound layer 92 is formed. Next, in a manner similar to that of the step of forming the resin layer 32 over the metal compound layer 22, a first layer is formed over the metal compound layer 92 and heat treatment is performed to form a resin layer 93. Then, in a manner similar to that of the step of forming the insulating layer 31 over the resin layer 32, an insulating layer 95 covering an end portion of the resin layer 93 is formed over the resin layer 93 (FIG. 9(A)). The metal compound layer 92 is covered with the resin layer 93. Thus, the portion where the metal compound layer 92 and the insulating layer 95 are in contact with each other can be reduced or even eliminated. Thus, film separation during the fabrication process of the display device can be prevented.

Next, a coloring layer 97 and a light-blocking layer 98 are formed over the insulating layer 95 (FIG. 9(B)).

A color filter or the like can be used as the coloring layer 97. The coloring layer 97 is provided to overlap with a display region of the light-emitting element 60.

A black matrix or the like can be used as the light-blocking layer 98. The light-blocking layer 98 is provided to overlap with the insulating layer 35.

Then, with the use of an adhesive layer 99, the surface of the formation substrate 10 over which the transistor 80 and the like are formed and the surface of the formation substrate 91 over which the resin layer 93 and the like are formed are bonded to each other (FIGS. 9(C1) and 9(C2)).

When the adhesive layer 99 includes a region that does not overlap with the metal compound layer 22 and the metal compound layer 92, separation failure is likely to occur in some cases depending on the area of the region and a degree of adhesion between the adhesive layer 99 and a layer in contact therewith.

Therefore, the adhesive layer 99 preferably overlaps with only a portion where both the metal compound layer 22 and the metal compound layer 92 are provided as shown in FIGS. 9(C1) and 9(C2). In other words, the adhesive layer 99 is not provided in a portion where neither the metal compound layer 22 nor the metal compound layer 92 is provided.

When an adhesive or an adhesive sheet having a low fluidity, for example, is used for the adhesive layer 99, the adhesive layer 99 can be easily formed to have an island-like shape (FIG. 9(C1)).

Alternatively, a frame-shaped partition 96 may be formed and the adhesive layer 99 may fill the space surrounded by the partition 96 and be cured (FIG. 9(C2)).

In the case where the partition 96 overlaps with the portion where the metal compound layer 22 and the metal compound layer 92 are not provided, an uncured resin or a semi-cured resin is preferably used for the partition 96. Thus, an increase in the adhesion of the portion where the metal compound layer 22 and the metal compound layer 92 are not provided is suppressed and separation of the formation substrates can be conducted easily.

In the case where the partition 96 is used as a component of a display device, a cured resin is preferably used for the partition 96. Here, the partition 96 preferably overlaps with only the portion where the metal compound layer 22 and the metal compound layer 92 are provided.

Note that in the case where the adhesive layer 99 includes a region that does not overlap with the metal compound layer 22 or the metal compound layer 92, the formation of a separation starting point enables separation at desired timing.

The following steps are described with reference to the stacked structure shown in FIG. 9(C1).

Figure 10A:
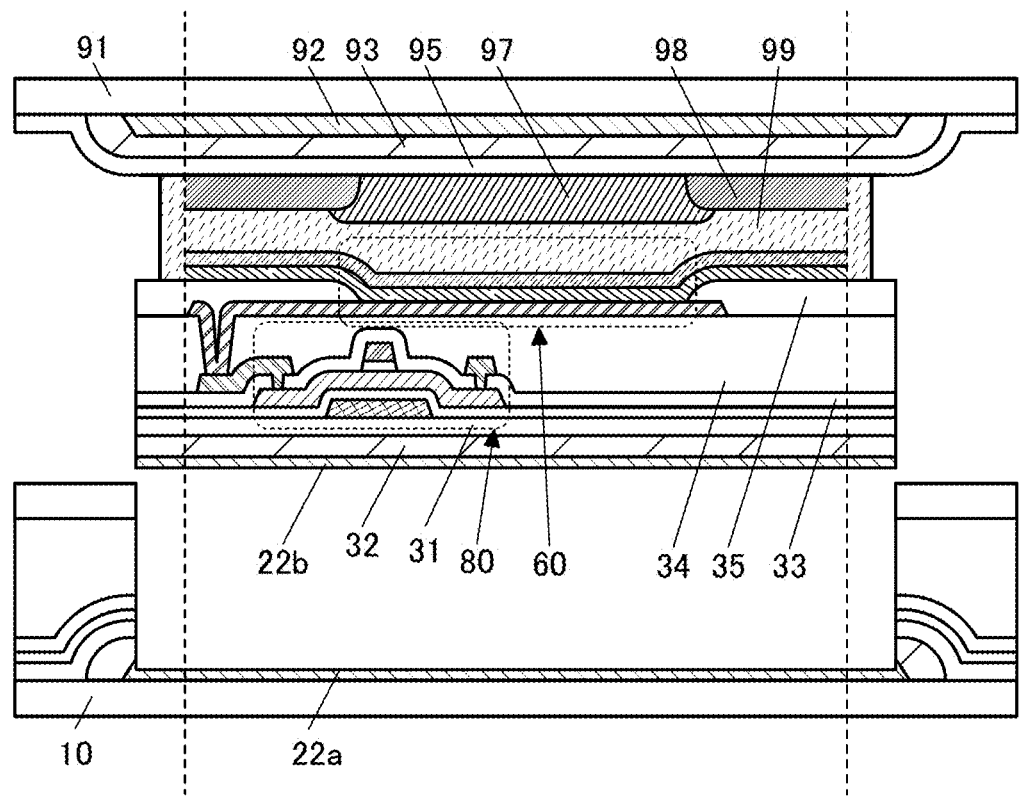
FIGS. 10A-10B are cross-sectional views illustrating an example of a fabrication method of a display device.

Either the formation substrate 10 or the formation substrate 91 may be separated first. In this example, separation of the formation substrate 10 precedes that of the formation substrate 91 (FIG. 10A). An end portion of the adhesive layer 99 is located inward from an end portion of the metal compound layer 22; thus, yield of the separation step can be improved. Although an example in which the functional layer in a portion where the metal compound layer 22 is not provided remains over the formation substrate 10 is shown here, this embodiment is not limited thereto. A part of the functional layer remains on the substrate 91 side in some cases.

As illustrated in FIG. 10(A), the separation interface is generated in the metal compound layer 22. The metal compound layer 22a remains on the formation substrate 10 side, and the metal compound layer 22b remains on the resin layer 32 side. In the separation method of one embodiment of the present invention, the functional layer including the transistor 80 can be separated from the formation substrate 10 without irradiating a wide area of the formation substrate 10 with laser light. Thus, a display device can be fabricated at a low cost.

Before the separation process, a separation starting point may be formed.

Figure 10B:
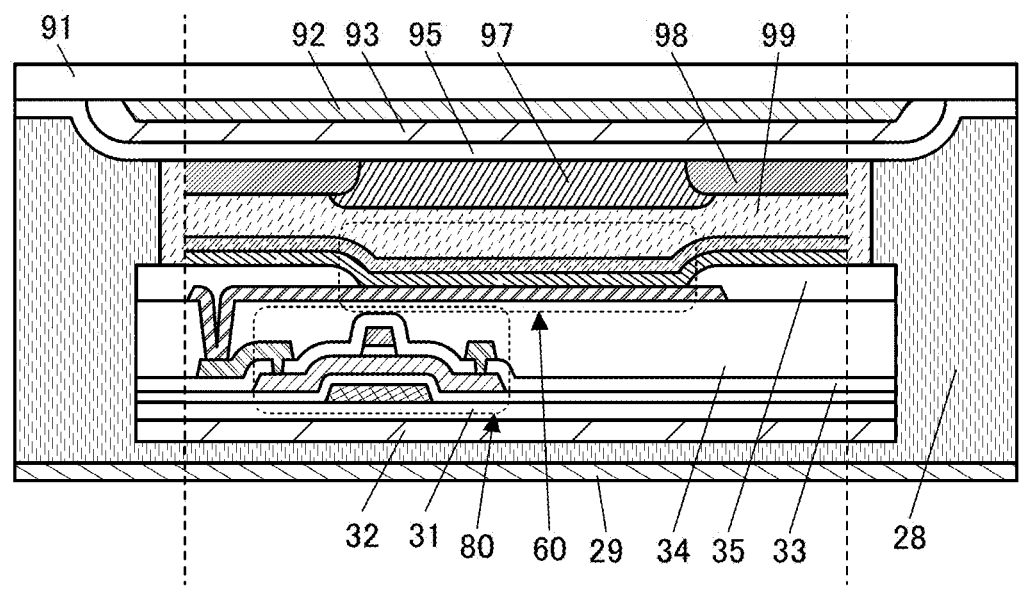

Next, the substrate 29 and the resin layer 32 that is exposed by being separated from the formation substrate 10 are bonded to each other using the adhesive layer 28 (FIG. 10(B)). The substrate 29 can function as a supporting substrate of the display device. FIG. 10(B) illustrates an example in which the metal compound layer 22b remaining on the resin layer 32 side is removed and the resin layer 32 is exposed; however, the metal compound layer 22b need not be removed.

Figure 11A:
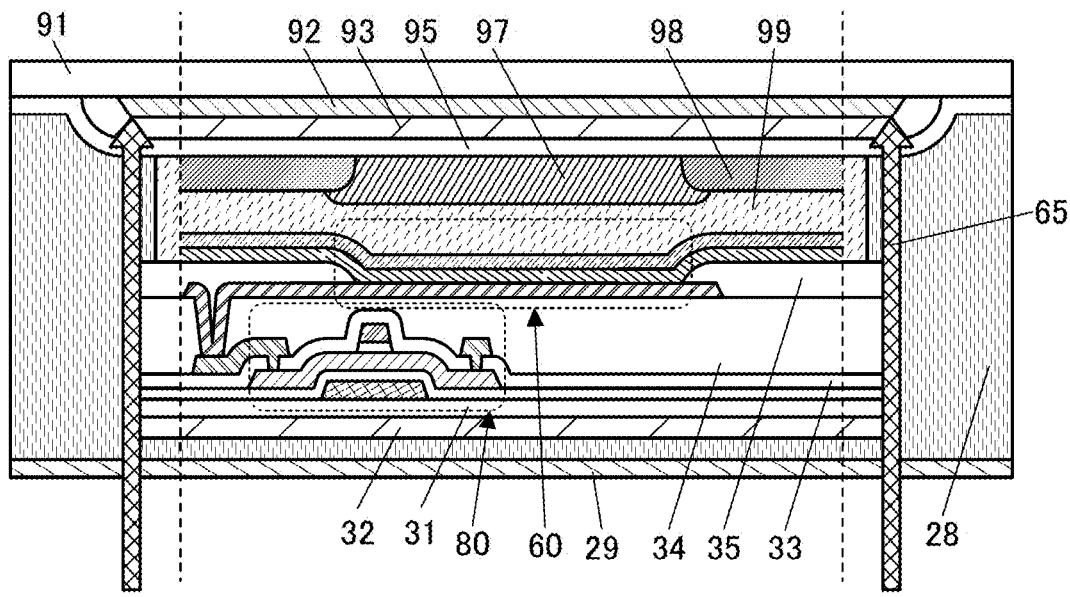
FIGS. 11A-11B are cross-sectional views illustrating an example of a fabrication method of a display device.

Next, a separation starting point is formed in the resin layer 93 (FIG. 11(A)).

In FIG. 11(A), the sharp instrument 65, e.g., a knife, is inserted from the substrate 29 side into a portion located inward from an end portion of the resin layer 93 to make a cut in a frame-like shape. This method is suitable for the case where a resin is used for the substrate 29.

Alternatively, the resin layer 93 may be irradiated with laser light, incident from the formation substrate 91 side, in a frame-like shape.

The formation of the separation starting point enables the resin layer 93 to be separated from the formation substrate 91 at desired timing. Accordingly, the timing of the separation can be controlled and the force required for the separation is small. This can increase the yield of the separation step and the fabrication process of the display device.

Figure 11B:
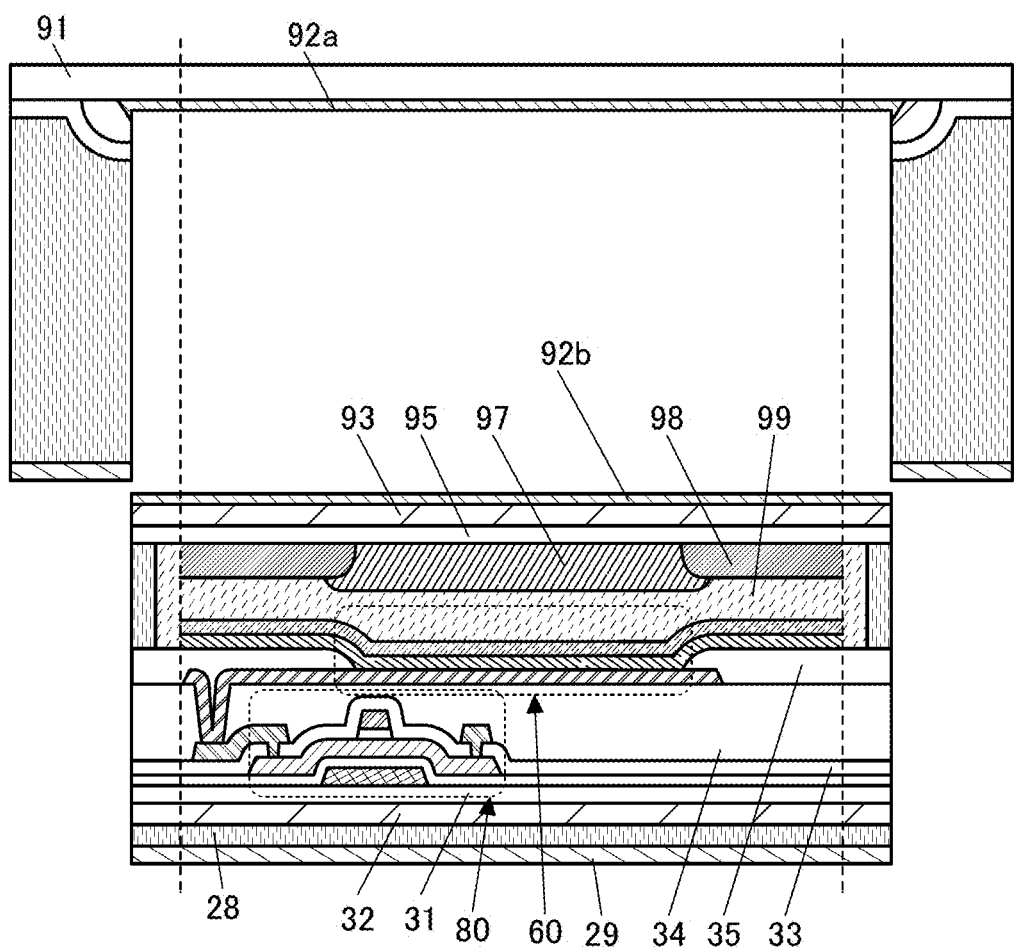

Next, the functional layer including the transistor 80 is separated from the formation substrate 91 (FIG. 11(B)). In this example, a portion inside the frame-like cut is separated from the formation substrate 91.

As illustrated in FIG. 11(B), the separation interface is generated in the metal compound layer 92. The metal compound layer 92a remains on the formation substrate 91 side and the metal compound layer 92b remains on the resin layer 93 side. In the separation method of one embodiment of the present invention, the functional layer including the transistor 80 can be separated from the formation substrate 91 without irradiating a wide area of the formation substrate 91 with laser light. Thus, a display device can be fabricated at a low cost.

Figure 12A:
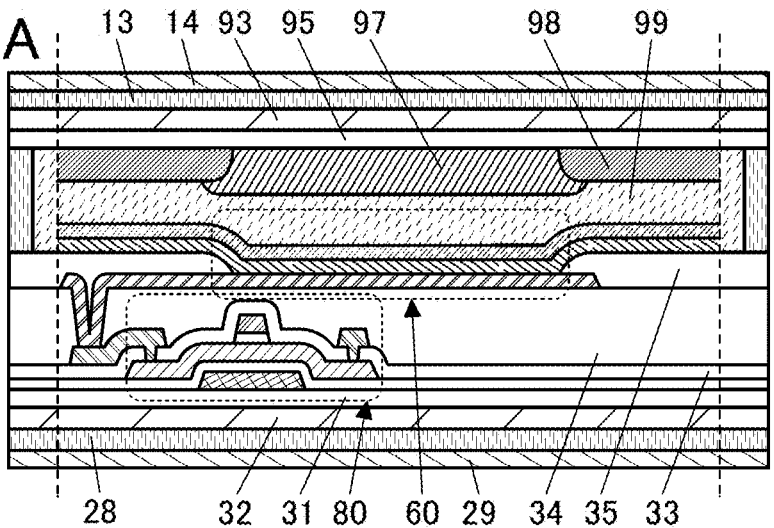
FIGS. 12A-12C are cross-sectional views illustrating an example of a fabrication method of a display device.

Next, a substrate 14 and the resin layer 93 that is exposed by being separated from the formation substrate 91 are bonded to each other using an adhesive layer 13 (FIG. 12(A)). The substrate 14 can function as a supporting substrate of the display device. FIG. 12(A) illustrates an example in which the metal compound layer 92b remaining on the resin layer 93 side is removed and the resin layer 93 is exposed; however, the metal compound layer 92b need not be removed.

In FIG. 12(A), light emitted from the light-emitting element 60 is extracted to the outside of the display device through the coloring layer 97, the insulating layer 95, and the resin layer 93. It is thus preferable that the resin layer 93 have a high visible light transmittance. In one embodiment of the present invention, the resin layer 93 can have a small thickness. Accordingly, the resin layer 93 can have a high visible light transmittance, which inhibits a reduction in light extraction efficiency of the light-emitting element 60.

Figure 12B:
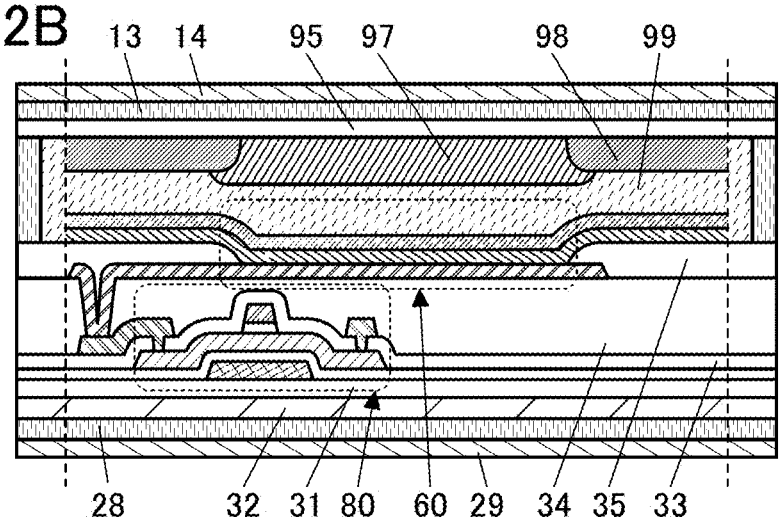

The resin layer 93 may be removed. In that case, the light extraction efficiency of the light-emitting element 60 can be further increased. FIG. 12(B) illustrates an example in which the resin layer 93 is removed and the substrate 14 is bonded to the insulating layer 95 with the adhesive layer 13.

The material that can be used for the adhesive layer 75b can be used for the adhesive layer 13.

The material that can be used for the substrate 75a can be used for the substrate 14.

Figure 12C:
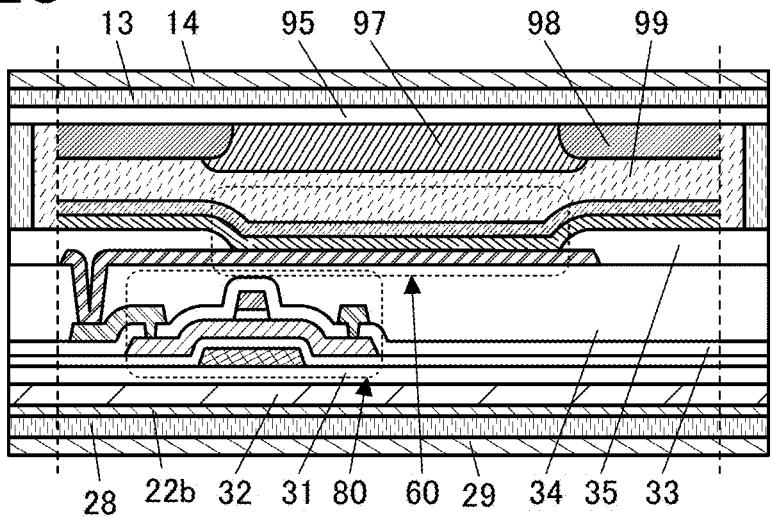

FIG. 12(C) illustrates an example in which the metal compound layer 22b remains in the display device. The metal compound layer 22b and the substrate 29 are bonded to each other with the adhesive layer 28.

In the fabrication method example 2, the separation method of one embodiment of the present invention is conducted twice to fabricate the display device. In one embodiment of the present invention, each of the functional elements and the like included in the display device is formed over the formation substrate; thus, even in the case where a high-resolution display device is fabricated, high alignment accuracy of a flexible substrate is not required. It is thus easy to attach the flexible substrate.

Structure Example 2 of Display Device

Figure 13A:
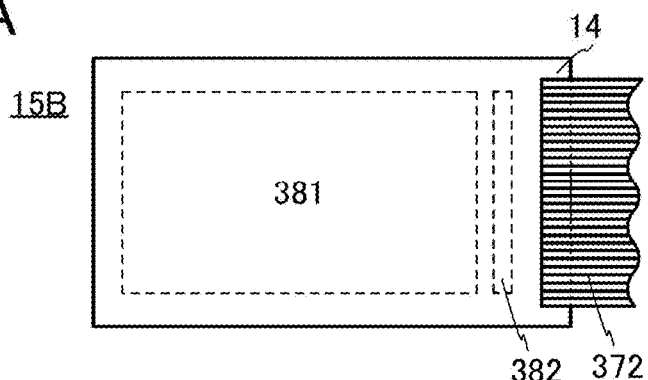
FIGS. 13A-13C are a top view and cross-sectional views illustrating examples of a display device.
Figure 13B:
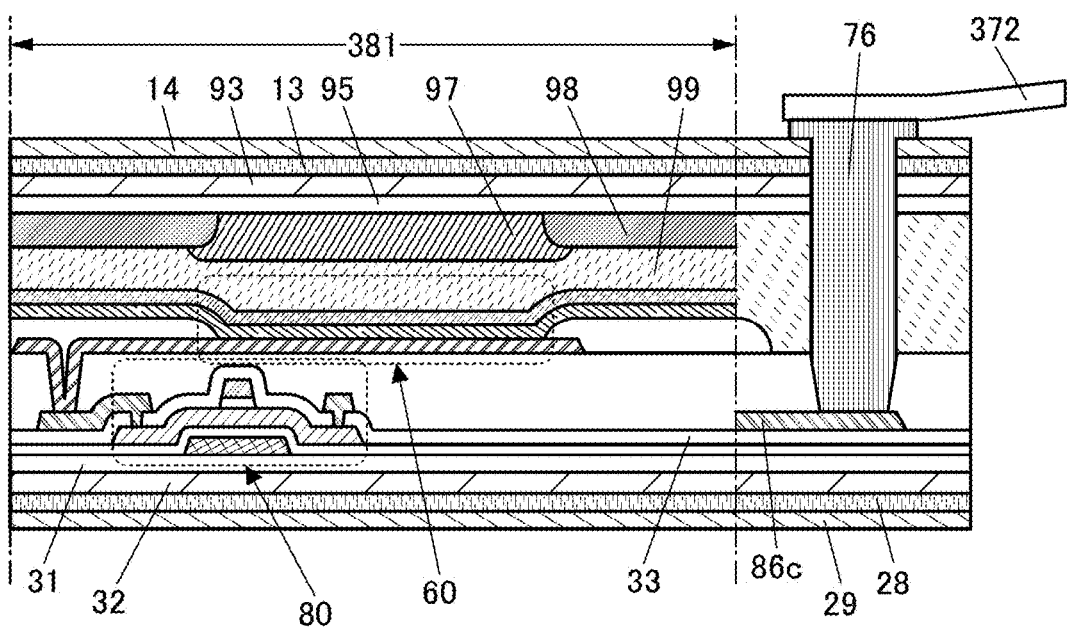
Figure 13C:
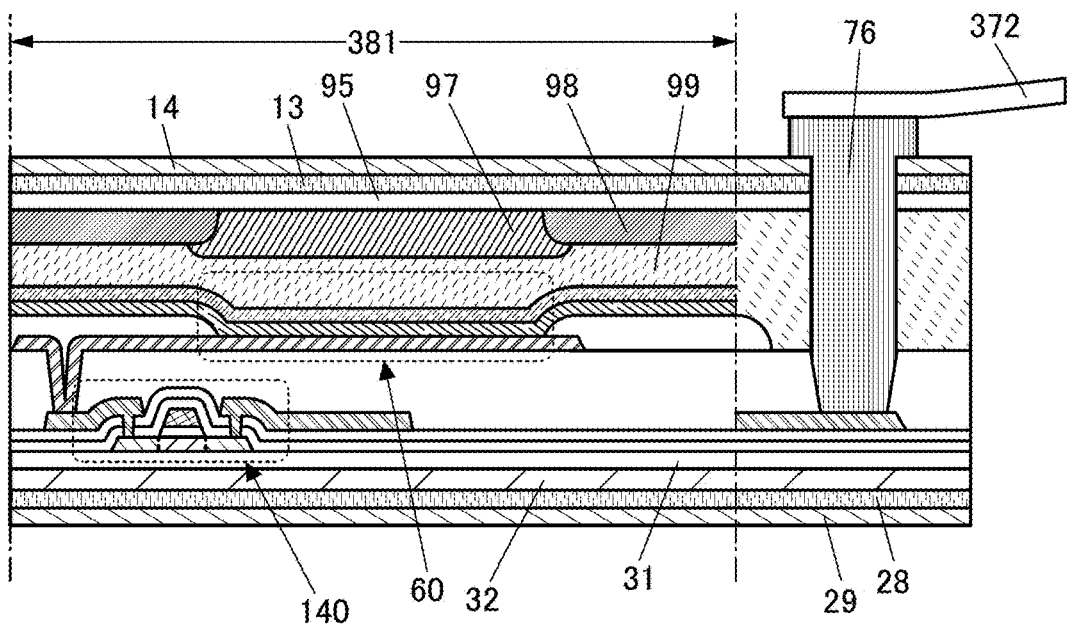

FIG. 13(A) is a top view of a display device 15B. FIGS. 13(B) and 13(C) are each an example of a cross-sectional view of the display portion 381 of the display device 15B and a cross-sectional view of a portion for connection to the FPC 372.

The display device 15B can be fabricated with the use of the above fabrication method example 2. The display device 15B can be held in a bent state and can be bent repeatedly, for example.

The display device 15B includes the substrate 14 and the substrate 29. The substrate 14 side is the display surface side of the display device 15B. The display device 15B includes the display portion 381 and the driver circuit portion 382. The FPC 372 is attached to the display device 15B.

A film is preferably used as each of the substrate 14 and the substrate 29, and use of a resin film is particularly preferable. In that case, the display device can be reduced in weight and thickness. The display device using a film substrate is more robust than that in the case of using glass, metal, or the like. In addition, the display device can have higher flexibility.

A conductive layer 86c and the FPC 372 are electrically connected through the connector 76 (FIG. 13(B)). The conductive layer 86c can be formed using the same material and the same step as those of the source and the drain of the transistor.

There is no limitation on the structure of the transistors included in the display device of this embodiment. For example, the display device may include a transistor 140 with a top gate structure as shown in FIG. 13(C).

[Metal Oxide]

A metal oxide functioning as an oxide semiconductor is preferably used for the semiconductor layer. A metal oxide that can be used for the semiconductor layer will be described below.

The metal oxide preferably contains at least indium or zinc. Containing indium and zinc both is particularly preferable. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Oxide semiconductors (metal oxides) can be classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. However, it is difficult to observe a clear crystal grain boundary in the CAAC-OS; thus, it can be said that a reduction in electron mobility due to the crystal grain boundary is less likely to occur. Furthermore, entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Accordingly, a metal oxide including a CAAC- OS is physically stable. Thus, the metal oxide including a CAAC-OS is resistant to heat and has high reliability.

In the nc-OS, a microscopic region (for example, a region with a size of 1 nm to 10 nm inclusive, in particular, a region with a size of 1 nm to 3 nm inclusive) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably 0% to 30% inclusive, further preferably 5% to 30% inclusive, still further preferably 7% to 15% inclusive.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

As described above, in the separation method of this embodiment, a portion with low adhesion is formed in the metal compound layer, whereby a functional layer formed over the metal compound layer can be separated from the substrate. Treatment using an expensive apparatus, such as linear laser beam irradiation, is not needed and thus, the separation method is low in cost.

Furthermore, over the formation substrate are provided a portion in contact with the metal compound layer and a portion in contact with the insulating layer, so that the functional layer can be separated from the formation substrate at desired timing. Therefore, display devices and the like can be fabricated at a low cost with high mass productivity by the separation method of this embodiment.

This embodiment can be combined with the other embodiments and the example as appropriate. In this specification, in the case where a plurality of structure examples are shown in one embodiment, the structure examples can be combined as appropriate.

Embodiment 2

In this embodiment, a display device of one embodiment of the present invention is described with reference to FIG. 14 to FIG. 17.

The display device of one embodiment of the present invention includes a first region, a second region, and a display region. The first region includes part of the display region. The second region includes another part of the display region. The second region includes a first member. The second region can be bent with the first member positioned on the outside of the display device. The first member includes a first elastic body and a second elastic body. An end portion of the second elastic body is covered partly or entirely with the first elastic body. The second elastic body has a higher elastic modulus than the first elastic body. The display region has a function of displaying an image in the direction of the side where the first member is not provided. The second region is preferably capable of being bent with a radius of curvature greater than 2 mm. The thickness of the second region is preferably smaller than the thickness obtained by adding 100 μm to the thickness of the first member. The first member preferably has a cross-sectional shape with thinning end portions. The first member preferably has a band-like shape that cuts across the display region.

It is preferable that the display device of one embodiment of the present invention further include a sealant, a first base, a second base, and a third region. The sealant is placed between the first base and the second base. The second base includes a region overlapping with the first base. The first region includes part of the overlapping region. The second region includes another part of the overlapping region. The third region includes the overlapping region, an end portion of the first base, the second base, and a second member. The second member covers an end portion of the first base. The second member has a lower moisture permeability than the sealant.

In the display device of one embodiment of the present invention, easiness with which the second region is bent can be adjusted. Alternatively, the second region can be bent with a radius of curvature greater than a predetermined radius of curvature. Alternatively, the second region can be bent such that the radius of curvature is not greater than a predetermined radius of curvature. Alternatively, a plurality of curved portions with different curvature radii can be formed in the second region. Alternatively, the second region can be bent in a U-shape. Alternatively, the second region can be bent repeatedly. Alternatively, an irreversible crease can be prevented from being formed. Alternatively, the display region overlapping with the second region can be protected. Alternatively, the strength of the second region can be increased. Consequently, a novel display device that is highly convenient or reliable can be provided.

Figure 14A:
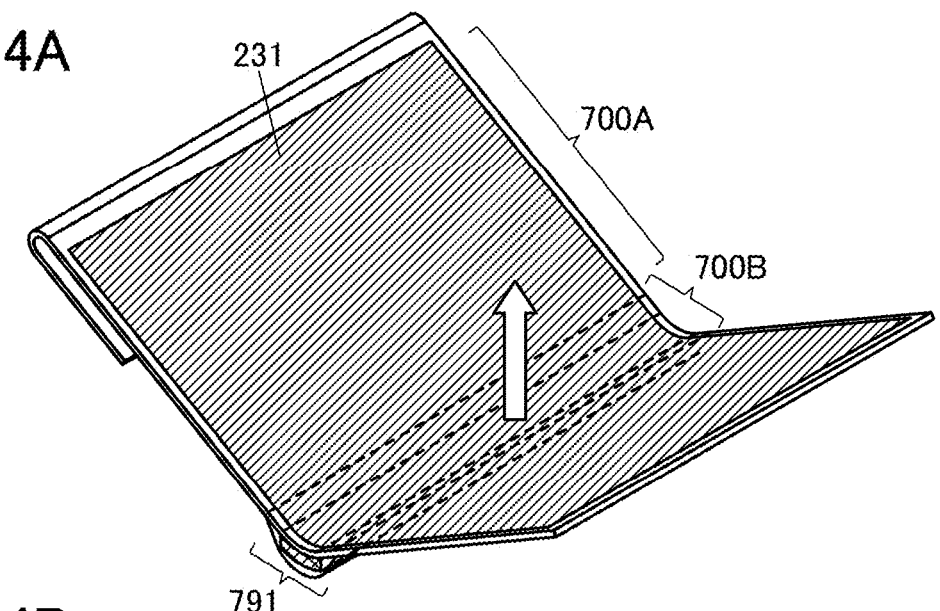
FIGS. 14A-14C are diagrams illustrating a structure of a display device.
Figure 14B:
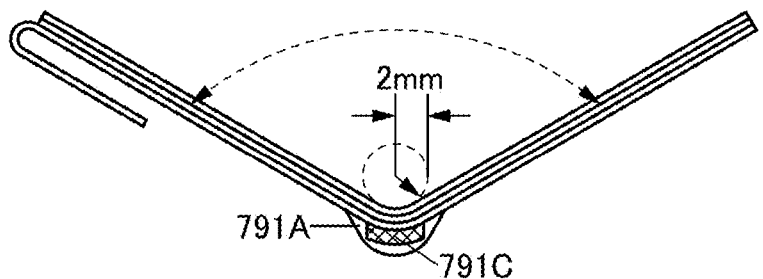
Figure 14C:
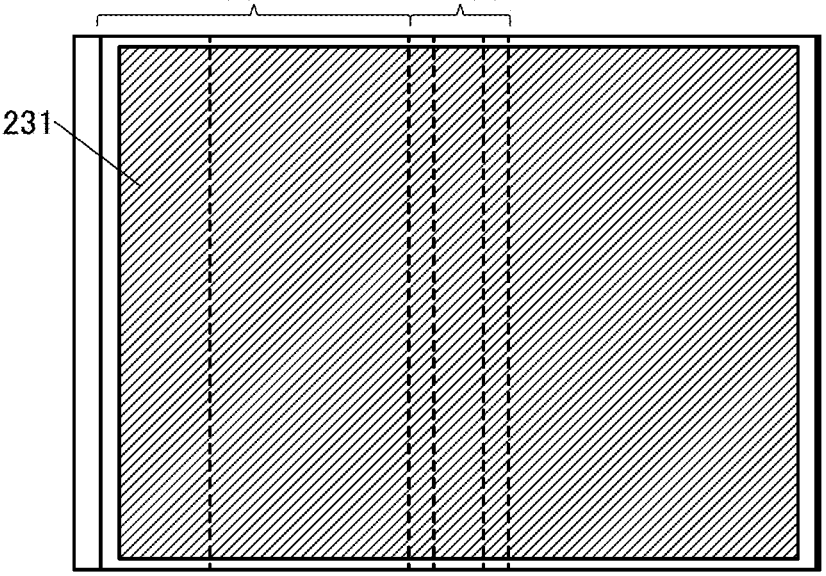

FIG. 14(A) shows a perspective view of a display device 700, FIG. 14(B) shows a side view of the display device 700, and FIG. 14(C) shows a top view of the display device 700.

The display device 700 includes a region 700A, a region 700B, and a display region 231.

The display region 231 has a function of displaying an image.

The region 700A includes part of the display region 231. The region 700B includes another part of the display region 231.

The region 700B includes a member 791. The region 700B can be bent with the member 791 positioned on the outside of the display device 700.

The member 791 includes an elastic body 791A and an elastic body 791C.

An end portion of the elastic body 791C is covered partly or entirely with the elastic body 791A. The elastic body 791C has a higher elastic modulus than the elastic body 791A.

Alternatively, the elastic body 791C has a smaller breaking elongation than the elastic body 791A. Note that breaking elongation refers to the ratio of increased length to initial length when the sample is broken in a tensile test.

A resin, rubber, urethane rubber, silicone rubber, or the like, for example, can be used for the elastic body 791A and the elastic body 791C.

Specifically, a material whose elastic modulus is 0.1 MPa to 0.8 MPa inclusive can be used for the elastic body 791A, and a material whose elastic modulus is 0.8 MPa to 1.2 MPa inclusive can be used for the elastic body 791C. Alternatively, a material whose breaking elongation is 350% can be used for the elastic body 791A, and a material whose breaking elongation is 200% can be used for the elastic body 791C.

The elastic body 791C is less likely to be bent compared with the elastic body 791A. Thus, when the region 700B is bent, the radius of curvature R3 of a portion P3 overlapping with the elastic body 791C is greater than the radius of curvature R1 of a portion P1 overlapping with the elastic body 791A (FIGS. 16(A) and 16(B)). The radius of curvature R2 of a portion overlapping with a boundary P2 between the elastic body 791C and the elastic body 791A is greater than the radius of curvature R1 and smaller than the radius of curvature R3.

Thus, easiness with which the region 700B is bent can be adjusted. Alternatively, the region 700B can be bent with a radius of curvature greater than a predetermined radius of curvature. Alternatively, the region 700B can be bent such that the radius of curvature is not greater than a predetermined radius of curvature. Alternatively, a plurality of curved portions with different curvature radii can be formed in the region 700B. Alternatively, the region 700B can be bent in a U-shape.

Alternatively, the region 700B can be bent repeatedly. Alternatively, an irreversible crease can be prevented from being formed. Alternatively, the display region 231 overlapping with the region 700B can be protected. Alternatively, the strength of the region 700B can be increased. Consequently, a novel display device that is highly convenient or reliable can be provided.

The display region 231 has a function of displaying an image in the direction of the side where the member 791 is not provided (FIG. 14(A)).

Thus, display can be performed without being blocked by the member 791. Alternatively, it is possible to prevent a crease from being formed in the region 700B. Consequently, a novel display device that is highly convenient or reliable can be provided.

The region 700B can be bent with a radius of curvature greater than 2 mm (FIG. 14(B)).

Thus, the display device can be bent repeatedly without causing defects. Alternatively, the thickness of the state where the display device is bent can be reduced. The display device can be bent with a radius of curvature of 5 mm or greater, preferably 2 mm or greater, for example. Specifically, the display device can be repeatedly bent 50,000 times or more. Consequently, a novel display device that is highly convenient or reliable can be provided.

Figure 16A:
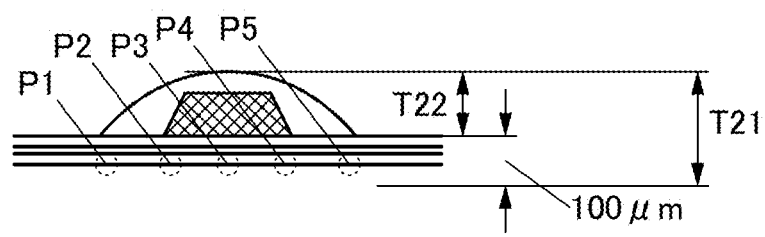
FIGS. 16A-16B are diagrams illustrating a structure of a display device.

The thickness of the region 700B is preferably smaller than the thickness T21 obtained by adding 100 μm to a thickness T22 of the member 791 (FIG. 16(A)). Note that the thickness of the region 700B is preferably smaller than the thickness obtained by adding 80 μm to the thickness T22 of the member 791, and more preferably smaller than the thickness obtained by adding 50 μm to the thickness T22.

Thus, the thickness of the display device can be reduced. Consequently, a novel display device that is highly convenient or reliable can be provided.

Figure 16B:
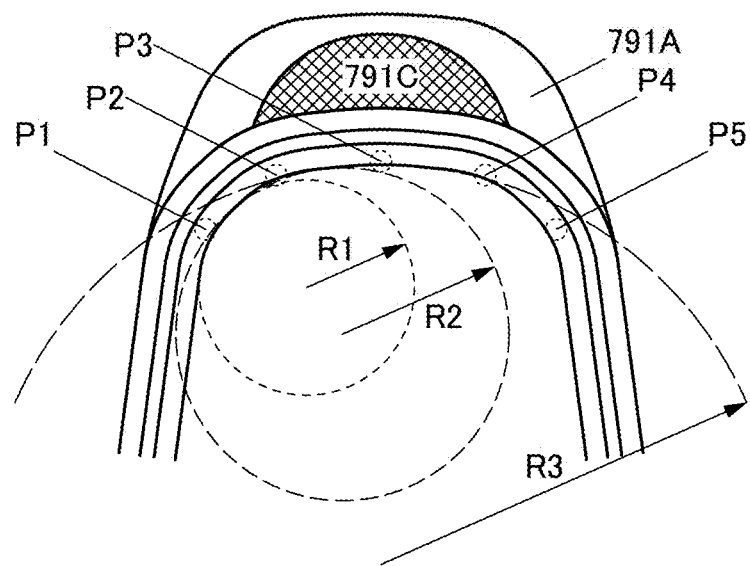

The member 791 preferably has a cross-sectional shape with thinning end portions (FIGS. 16(A) and 16(B)).

This can make the stiffness of the member 791 gradually decrease toward the end portions. Alternatively, the region 700B can be bent in such a way that the radius of curvature decreases little by little toward the end portions. Consequently, a novel display device that is highly convenient or reliable can be provided.

Figure 15A:
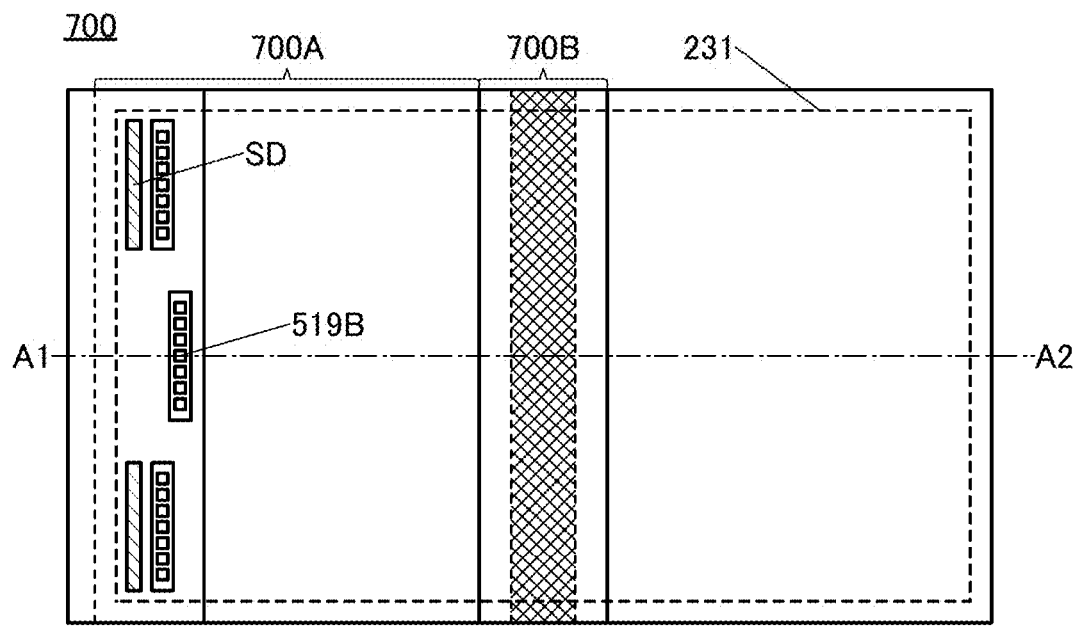
FIGS. 15A-15C are diagrams illustrating a structure of a display device.
Figure 15B:
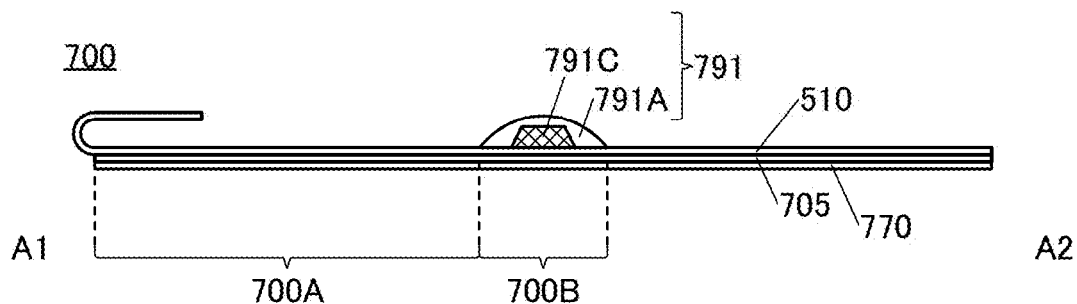

The member 791 has a band-like shape that cuts across the display region 231 (FIGS. 15(A) and 15(B)).

Figure 15C:
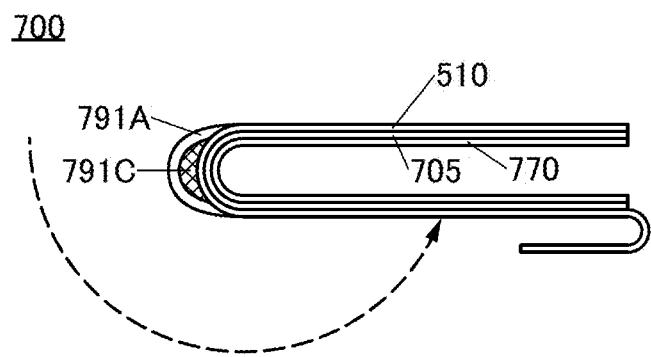

This enables the display region to be folded in two along the member 791 (FIG. 15(C)). Alternatively, this enables part of the display region to face the other part of the display region. Alternatively, the external size of the display device can be reduced. Consequently, a novel display device that is highly convenient or reliable can be provided.

Figure 17A:
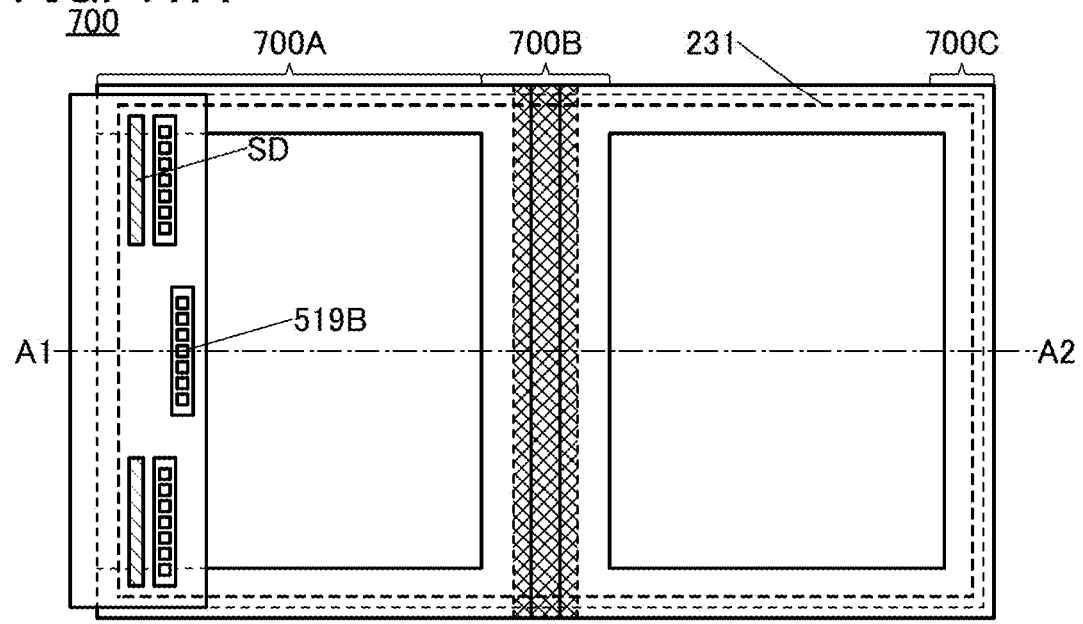
FIGS. 17A-17C are diagrams illustrating a structure of a display device.
Figure 17B:
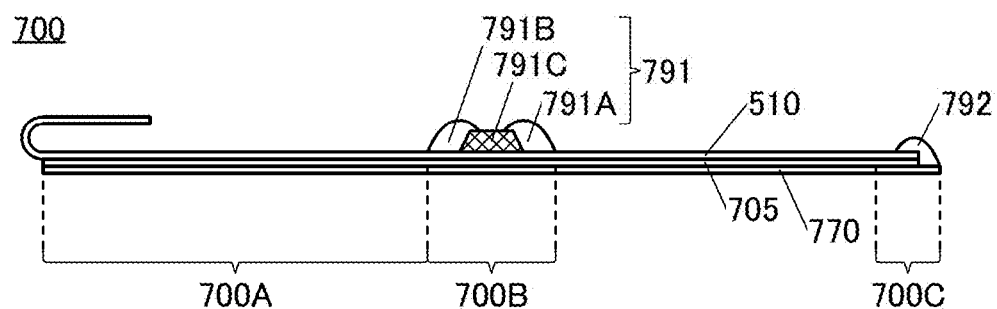

The display device 700 further includes a sealant 705, a base 510, a base 770, and a region 700C (FIGS. 17(A) and 17(B)). The member 791 in FIG. 17(B) includes an elastic body 791A, an elastic body 791B, and an elastic body 791C. Note that the elastic body 791C has an end portion that is partly covered with the elastic body 791B, and the elastic body 791C has a higher elastic modulus than the elastic body 791B. Alternatively, the elastic body 791C has a smaller breaking elongation than the elastic body 791B. A material that can be used for the elastic body 791A can be used for the elastic body 791B, for example.

The sealant 705 is placed between the base 510 and the base 770.

The base 770 has a region overlapping with the base 510.

The region 700A includes part of the above-described overlapping region, and the region 700B includes another part of the above-described overlapping region.

The base 510 and the base 770 have flexibility.

At least one of organic materials such as a resin, a resin film, or plastic can be used for the base 510 or the base 770, for example. Specifically, a resin film or a resin plate of polyester, polyolefin, polyamide, polyimide, polycarbonate, an acrylic resin, or the like can be used. As a result, the weight can be reduced. Alternatively, for example, the frequency of occurrence of breakage due to dropping or the like can be reduced. In addition, any of a variety of materials described in Embodiment 1 as examples of the material of the substrate 75a can be used for each of the base 510 and the base 770.

With use of the separation method and the fabrication method of a display device of embodiments of the present invention, which are described in Embodiment 1, the transistor, the capacitor, and the like that are formed over the formation substrate can be transferred to the base 510 or the base 770. Thus, a display device of this embodiment can be fabricated at a low cost and with high mass productivity.

Figure 17C:
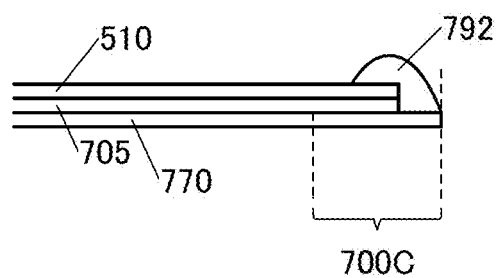

The region 700C includes the above-described overlapping region, an end portion of the base 510, the base 770, and a member 792 (FIG. 17(C)).

The member 792 covers the end portion of the base 510, and the member 792 has lower moisture permeability than the sealant 705.

Part of the member 791 can be used for the member 792, for example. Specifically, the elastic body 791A or the elastic body 791B can be used for the member 792.

Alternatively, a film or a stacked-layer film can be used for the member 792. Specifically, materials with a moisture permeability of $10^{-5}$ g/(m²·day) or lower, preferably $10^{-6}$ g/(m²·day) or lower can be used for the member 792. For example, a material including one or each of an inorganic film and an organic film can be used for the member 792. Specifically, a metal film, a film containing a metal and oxygen, a film containing a metal and nitrogen, a film containing a cross-linking polymer, or the like can be used for the member 792.

Alternatively, a material with an elastic modulus higher than or equal to that of the elastic body 791A can be used for the member 792. Alternatively, a material with an elastic modulus higher than or equal to that of the elastic body 791B can be used for the member 792. A material with a breaking elongation smaller than or equal to that of the elastic body 791A can be used for the member 792. Alternatively, a material with a breaking elongation smaller than or equal to that of the elastic body 791B can be used for the member 792. Alternatively, a material with a stiffness higher than or equal to that of the member 791 can be used for the member 792.

This can prevent diffusion of impurities into the base 510 and the base 770. Alternatively, the end portion of the base 510 can be protected. Consequently, a novel display device that is highly convenient or reliable can be provided.

This embodiment can be combined with the other embodiments and the example as appropriate.

Embodiment 3

In this embodiment, electronic devices of embodiments of the present invention will be described with reference to FIG. 18.

Highly reliable electronic devices with curved surfaces can be fabricated in accordance with one embodiment of the present invention. In addition, a flexible and highly reliable electronic device can be fabricated in accordance with one embodiment of the present invention.

Examples of the electronic devices include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 18A:
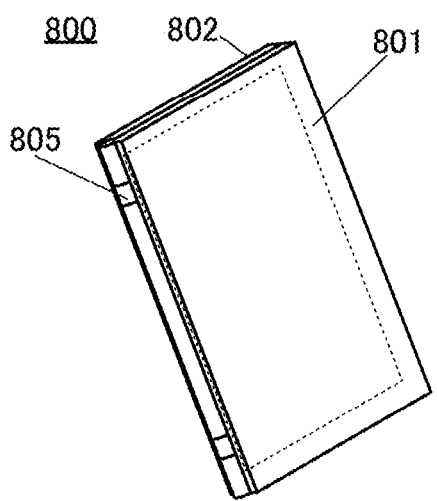
Figure 18B:
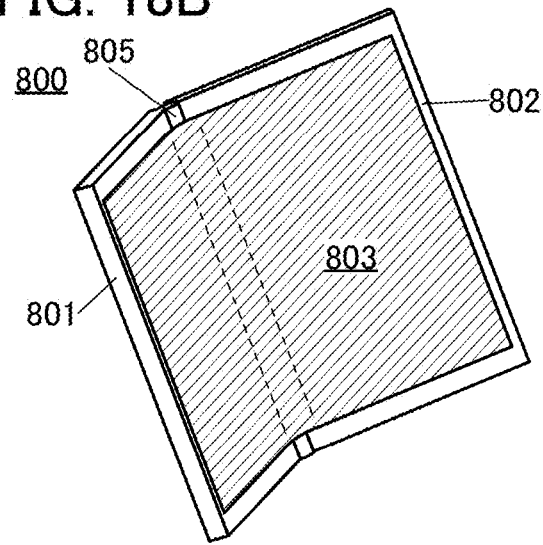

A portable information terminal 800 illustrated in FIGS. 18(A) and 18(B) includes a housing 801, a housing 802, a display portion 803, a hinge portion 805, and the like.

The housing 801 and the housing 802 are joined together with the hinge portion 805. The portable information terminal 800 can be opened as shown in FIG. 18(B) from a folded state (FIG. 18(A)). Thus, the portable information terminal 800 has high portability when carried and excellent visibility with its large display region when used.

In the portable information terminal 800, the display portion 803 that is flexible is provided across the housing 801 and the housing 802 which are joined together by the hinge portion 805.

The display device fabricated using one embodiment of the present invention can be used for the display portion 803. Thus, the portable information terminal can be fabricated in a high yield. Furthermore, the display device described in Embodiment 2 can be used for the display portion 803.

The display portion 803 can display at least one of text information, a still image, a moving image, and the like. When text information is displayed on the display portion, the portable information terminal 800 can be used as an e-book reader.

When the portable information terminal 800 is opened, the display portion 803 is held with the radius of curvature being large. For example, the display portion 803 is held while including a curved portion with a radius of curvature of 1 mm to 50 mm inclusive, preferably 5 mm to 30 mm inclusive. Part of the display portion 803 can display an image while being curved since pixels are continuously arranged from the housing 801 to the housing 802.

The display portion 803 functions as a touch panel and can be controlled with a finger, a stylus, or the like.

The display portion 803 is preferably formed using one flexible display. Thus, a seamless continuous image can be displayed between the housing 801 and the housing 802. Note that each of the housing 801 and the housing 802 may be provided with a display.

The hinge portion 805 preferably includes a locking mechanism so that an angle formed between the housing 801 and the housing 802 does not become larger than a predetermined angle when the portable information terminal 800 is opened. For example, an angle at which they become locked (they are not opened any further) is preferably greater than or equal to 90° and less than 180° and can be typically 90°, 120°, 135°, 150°, 175°, or the like. In that case, the convenience, safety, and reliability of the portable information terminal 800 can be improved.

When the hinge portion 805 includes a locking mechanism, excessive force is not applied to the display portion 803; thus, breakage of the display portion 803 can be prevented. Thus, a highly reliable portable information terminal can be achieved.

A power button, an operation button, an external connection port, a speaker, a microphone, or the like may be provided for the housing 801 and the housing 802.

Either one of the housing 801 and the housing 802 is provided with a wireless communication module, and data can be transmitted and received through a computer network such as the Internet, a LAN (Local Area Network), or Wi-Fi (registered trademark).

Figure 18C:
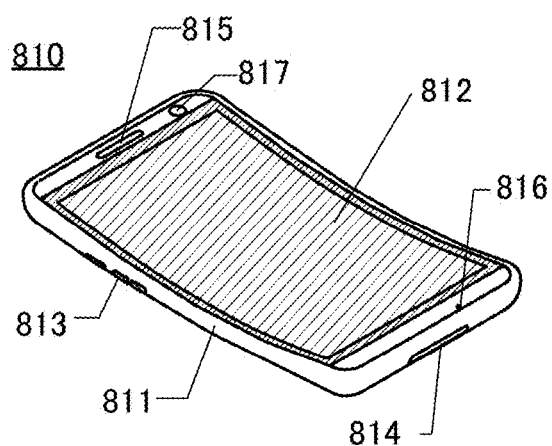

A portable information terminal 810 illustrated in FIG. 18(C) includes a housing 811, a display portion 812, an operation button 813, an external connection port 814, a speaker 815, a microphone 816, a camera 817, and the like.

The display device fabricated using one embodiment of the present invention can be used for the display portion 812. Thus, the portable information terminal can be fabricated in a high yield.

The portable information terminal 810 includes a touch sensor in the display portion 812. All operations including making a call and inputting text can be performed by touch on the display portion 812 with a finger, a stylus, or the like.

In addition, the operation of the operation button 813 can turn ON/OFF the power and switch types of images displayed on the display portion 812. For example, switching from a mail creation screen to a main menu screen can be performed.

When a detection device such as a gyroscope sensor or an acceleration sensor is provided inside the portable information terminal 810, the direction of display on the screen of the display portion 812 can be automatically changed by determining the orientation of the portable information terminal 810 (whether it is placed horizontally or vertically). Furthermore, the direction of display on the screen can be changed by touch on the display portion 812, operation with the operation button 813, sound input using the microphone 816, or the like.

The portable information terminal 810 has, for example, one or more functions selected from a telephone set, a notebook, an information browsing system, and the like. Specifically, the portable information terminal can be used as a smartphone. The portable information terminal 810 is capable of executing a variety of applications such as mobile phone calls, e-mailing, text viewing and writing, music replay, video replay, Internet communication, and games, for example.

Figure 18D:
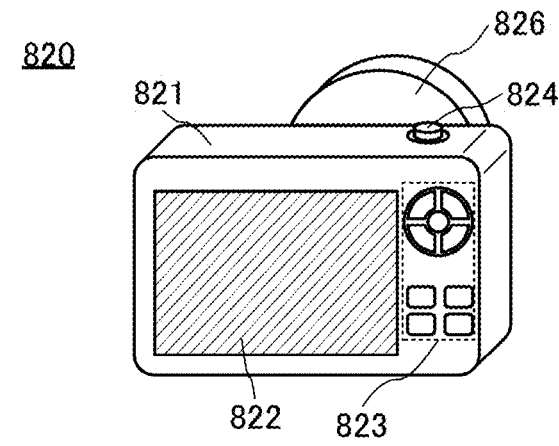

A camera 820 illustrated in FIG. 18(D) includes a housing 821, a display portion 822, operation buttons 823, a shutter button 824, and the like. Furthermore, a detachable lens 826 is attached to the camera 820.

The display device fabricated using one embodiment of the present invention can be used for the display portion 822. Thus, the camera can be manufactured in a high yield.

Although the camera 820 here is configured such that the lens 826 is detachable from the housing 821 for replacement, the lens 826 may be integrated with the housing 821.

A still image or a moving image can be taken with the camera 820 at the press of the shutter button 824. In addition, the display portion 822 has a function of a touch panel, and images can also be taken by the touch on the display portion 822.

Note that a stroboscope, a viewfinder, or the like can be additionally attached to the camera 820. Alternatively, these may be incorporated into the housing 821. FIGS. 18(E1), 18(E2), 18(F1), and 18(F2) are modification examples of the display region of the portable information terminals. A perspective view of the front surface side of a portable information terminal 830 is illustrated in FIG. 18(E1), and a perspective view of the back surface side is illustrated in FIG. 18(E2). A perspective view of the front surface side of a portable information terminal 840 is illustrated in FIG. 18(F1), and a perspective view of the back surface side is illustrated in FIG. 18(F2). A display portion is provided only on one surface of the housing in the portable information terminal 810 illustrated in FIG. 18(C); however, the display portion may be provided over a plurality of surfaces. For example, FIGS. 18(E1) and 18(E2) illustrate an example in which the display region 832 includes a display region 832a overlapping with a front surface of the housing 831, a display region 832b overlapping with a first side surface of the housing 831, and a display region 832c overlapping with a second side surface, opposite the first side surface. As illustrated in FIG. 18(E2), the display regions 832b and 832c may extend to part of the back surface of the housing 831. FIGS. 18(F1) and 18(F2) illustrate an example in which the display region 842 includes a display region 842a overlapping with a front surface of the housing 841 and a display region 842b overlapping with a first side surface and a back surface of the housing 841. As illustrated in FIG. 18(F2), the display region 842b may take up half or more of the area of the back surface of the housing 841.

This embodiment can be combined with the other embodiments and the example as appropriate.

Example 1

In this example, the results of separating a functional layer from a formation substrate will be described.

[Sample Fabrication 1]

A fabrication method of a sample of this example is described with reference to FIG. 1. First, a metal layer 20 was formed over a formation substrate 10 (FIG. 1(A)). As the formation substrate 10, an approximately 0.7-mm-thick glass substrate was used. As the metal layer 20, an approximately 35-nm-thick titanium film was deposited by a sputtering method.

Next, first plasma treatment was performed on the surface of the metal layer 20, whereby a metal compound layer 21 was formed (FIG. 1(B)). In this example, $C_4F_8$ plasma treatment was performed as the first plasma treatment. In the $C_4F_8$ plasma treatment, the bias power was 1000 W, the ICP power was 6000 W, the pressure was 0.67 Pa, the duration of the treatment was 30 sec, and $C_4F_8$ gas with a flow rate of 100 sccm was used as the process gas.

Next, second plasma treatment was performed on the surface of the metal compound layer 21, whereby a metal compound layer 22 was formed (FIG. 1(C)). In this example, $H_2O$ plasma treatment was performed as the second plasma treatment. In the $H_2O$ plasma treatment, the bias power was 4500 W, the ICP power was 0 W, the pressure was 15 Pa, the duration of the treatment was 120 sec, and $H_2O$ gas with a flow rate of 250 sccm was used as the process gas.

Next, a first layer 30 was formed over the metal compound layer 22 (FIG. 1(D)). The first layer 30 was formed using a photosensitive material containing a polyimide resin precursor. The thickness at the time of application of the material was approximately 3.0 μm.

Next, heat treatment was performed on the first layer 30, whereby a resin layer 32 was formed (FIG. 1(E)). As the heat treatment, one-hour-long baking was performed at 400° C. while nitrogen gas was supplied.

Next, a functional layer 25 was formed over the resin layer 32. As the functional layer 25, a stacked-layer structure including a silicon oxynitride film and a silicon nitride film was formed. The thickness of the stacked-layer structure was approximately 650 nm.

Next, a substrate 75a was attached to the functional layer 25 with an adhesive layer 75b (FIG. 1(F)). An epoxy resin was used for the adhesive layer 75b, and a resin film was used for the substrate 75a.

[Separation 1]

In this example, two of the above-described samples were fabricated. Then, for one of them, the functional layer 25 was separated from the formation substrate 10 while supplying water to the separation surface, and for the other one of them, the functional layer 25 was separated from the formation substrate 10 without supplying water to the separation surface. As shown in FIGS. 1(G1) and 1(G2), the functional layer 25 was separated from the formation substrate 10 when separation occurred in the metal compound layer 22. A metal compound layer 22a remained on the formation substrate 10 side, and a metal compound layer 22b remained on the resin layer 32 side.

Note that the force required for separation of the sample with water supplied to the separation surface was 0.063 N, and the force required for separation of the sample without water supplied to the separation surface was 0.099 N. Supplying water to the separation surface decreased the force required for the separation and improved the separating property, as compared with the case without supplying water.

The above results demonstrated that the use of the separation method of one embodiment of the present invention enabled the functional layer 25 to be separated from the formation substrate 10 without a step of irradiating a wide area of the formation substrate 10 with laser light.

Note that the functional layer 25 was able to be separated from the formation substrate 10 even after a wide area of the formation substrate 10 was irradiated with laser light. This demonstrated that the separation method of one embodiment of the present invention was applicable to a separation method using a laser.

Note that the functional layer 25 was able to be separated from the formation substrate 10 in a structure where the functional layer 25 was formed directly over the metal compound layer 22 without the resin layer 32 being provided.

[Cross-Sectional Observation Before and after Separation]

Next, the results of observation of the cross section before and after the separation will be described. For the cross-sectional observation, a scanning transmission electron microscope (STEM) was used.

Figure 19A:
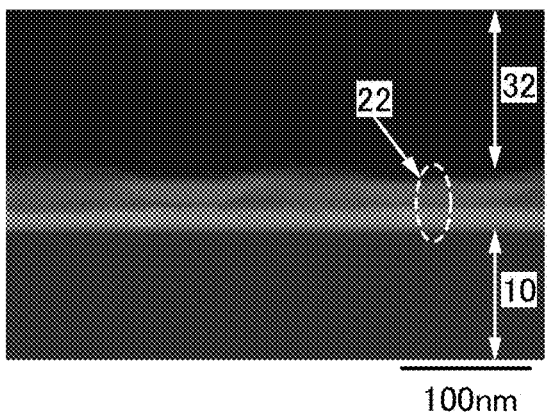
FIGS. 19A-19C are cross-sectional STEM images before and after separation.
Figure 19B:
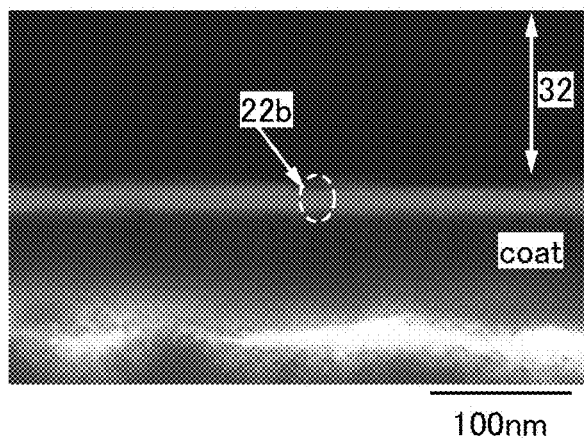
Figure 19C:
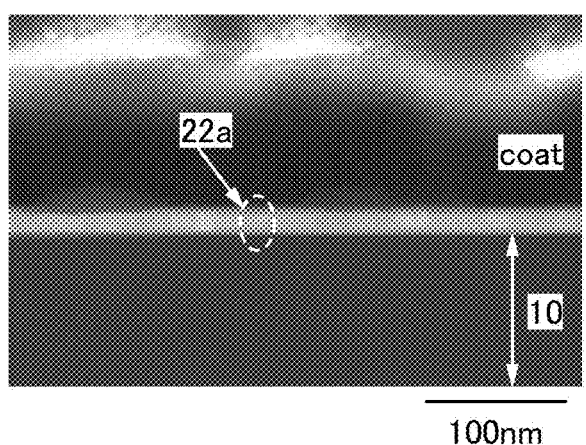

A cross-sectional STEM image of a stacked-layer structure including the formation substrate 10, the metal compound layer 22, and the resin layer 32 before the separation is shown in FIG. 19(A). A cross-sectional STEM image of the resin layer 32 side after the separation is shown in FIG. 19(B), and a cross-sectional STEM image of the formation substrate 10 side after the separation is shown in FIG. 19(C). Note that a layer positioned below the metal compound layer 22b in FIG. 19(B) is a coating layer that was formed for the observation. Similarly, a layer positioned above the metal compound layer 22a in FIG. 19(C) is also a coating layer that was formed for the observation.

As shown in FIG. 19(A), the metal compound layer 22 before the separation was found divided into two (upper and lower) layers. Furthermore, unevenness was observed in part of the boundary between the two layers; specifically, formation of bumps was observed in the lower layer. As shown in FIGS. 19(B) and 19(C), the metal compound layer 22a remaining on the formation substrate 10 side and the metal compound layer 22b remaining on the resin layer 32 side were observed after the separation.

Furthermore, from the results of STEM-energy dispersive X-ray spectroscopy (STEM-EDX) analysis, it was found that the boundary between the two layers and the vicinity thereof, and the bumps formed on the lower layer were high in fluorine.

[Cross-Sectional Observation after Each Step]

The cross section was observed after each step to examine what kind of changes were caused in the metal layer 20 during each step from the formation of the metal layer 20 to the formation of the interface that can be separated.

Figure 20A:
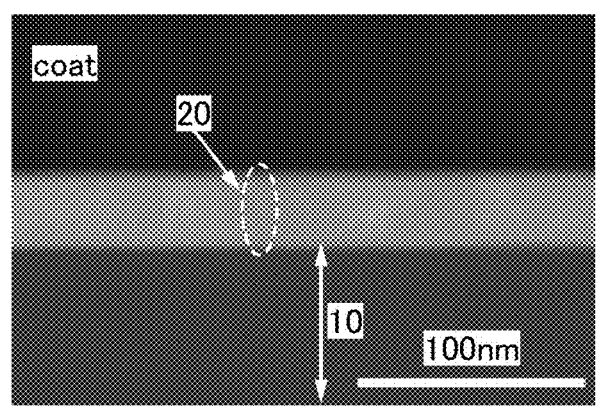
FIGS. 20A-20D are cross-sectional STEM images after each step.

A cross-sectional STEM image after the formation of the metal layer 20 (FIG. 1(A)) is shown in FIG. 20(A). It was found from FIG. 20(A) that a single-layer titanium film was formed over the glass substrate.

Figure 20B:
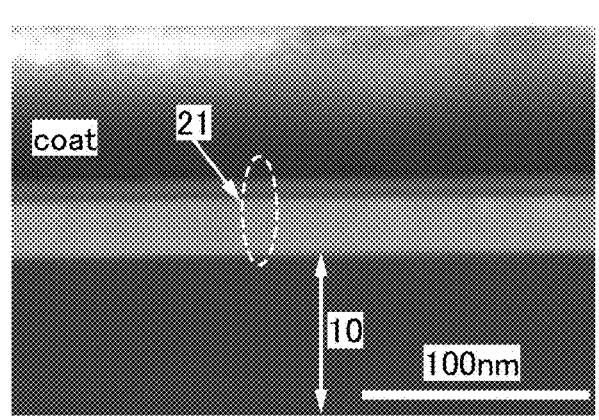

A cross-sectional STEM image after $C_4F_8$ plasma treatment (FIG. 1(B)) is shown in FIG. 20(B). It was found from FIG. 20(B) that the titanium film (or the titanium compound film) was divided into two (upper and lower) layers. At the boundary between the two layers, substantial unevenness like the one shown in FIG. 19(A) was not observed.

Figure 20C:
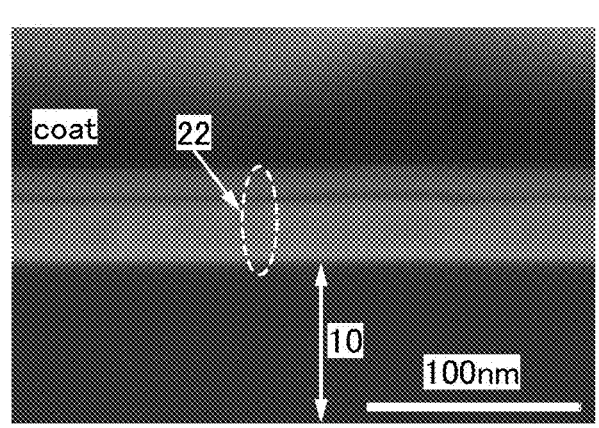

A cross-sectional STEM image after $H_2O$ plasma treatment (FIG. 1(C)) is shown in FIG. 20(C). As shown in FIG. 20(C), substantial unevenness like the one shown in FIG. 19(A) was not observed at the boundary between the two layers, even after the $H_2O$ plasma treatment. In addition, the separating property of the metal compound layer was extremely small at this point.

Figure 20D:
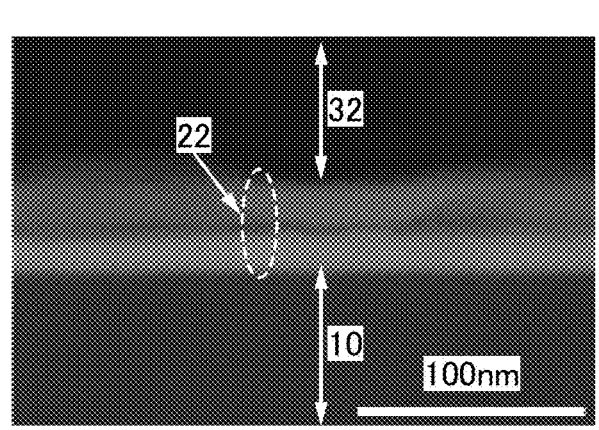

A cross-sectional STEM image after the formation of the resin layer 32 by heat treatment (FIG. 1(E)) is shown in FIG. 20(D). It was found from FIG. 20(D) that unevenness was formed at the boundary between the two layers.

From the above results, it was found that the titanium film was divided into two layers by the $C_4F_8$ plasma treatment, and that unevenness was generated within (at the boundary between the two layers) the titanium compound film by heat treatment. Note that the separating property of the metal compound layer before the heat treatment being performed was low, which suggested that performing the heat treatment or generating unevenness at the boundary between the two layers could increase the separating property of the metal compound layer.

[Observation of Separation Surface]

Next, the results of observation of the surface exposed by the separation (also referred to as separation surface) will be described. For the surface observation, a scanning electron microscope (SEM) was used.

At the time of the SEM observation, each sample was placed with the separation surface facing upward, and the observation was performed under a condition where the stage tilt angle was 30°.

Figure 21A:
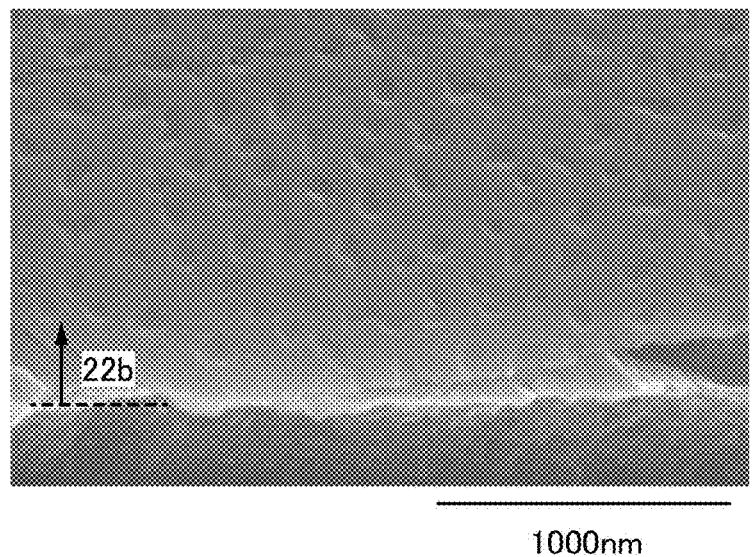
FIGS. 21A-21B are surface STEM images of separated surfaces.
Figure 21B:
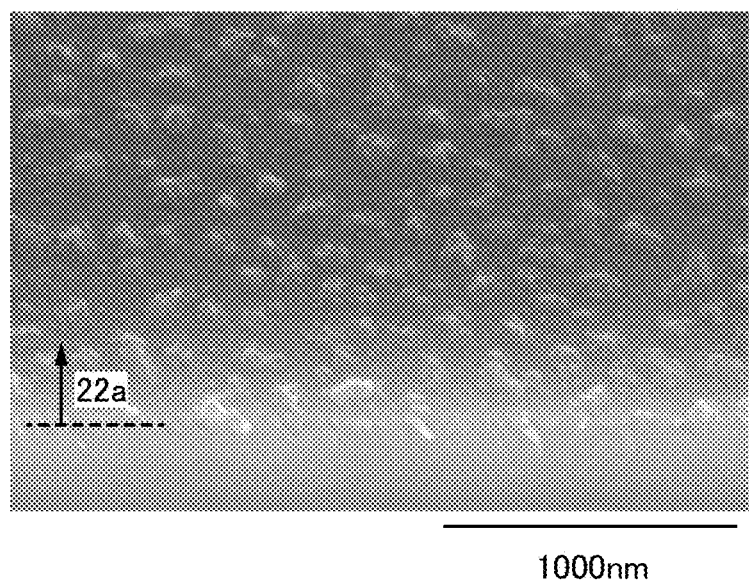

A surface SEM image of the separation surface of the resin layer 32 side is shown in FIG. 21(A), and a surface SEM image of the separation surface of the formation substrate 10 side is shown in FIG. 21(B). That is to say, the surface of the metal compound layer 22b was observed in FIG. 21(A), and the surface of the metal compound layer 22a was observed in FIG. 21(B) (see FIG. 1(G1)). The upper portion (upper side of the dotted line) of the image shown in FIG. 21(A) or 21(B) is the surface of the metal compound layer, and the lower portion (lower side of the dotted line) is the cross section.

Bumps were observed in the metal compound layer 22a remaining on the resin layer 32 side and dips were observed in the metal compound layer 22b remaining on the formation substrate 10 side, in such a way as to correspond to the unevenness observed in the cross-sectional STEM observation. This indicated that the separation occurred along the interface between the two (upper and lower) layers formed in the metal compound layer.

[Analysis of Separation Surface]

Next, the results of analyzing the separation surface using X-ray photoelectron spectroscopy (XPS) will be described. Here, each of the separation surface of the formation substrate 10 side (i.e., the surface of the metal compound layer 22a) and the separation surface of the resin layer 32 side (i.e., the surface of the metal compound layer 22b) was analyzed.

Figure 22:
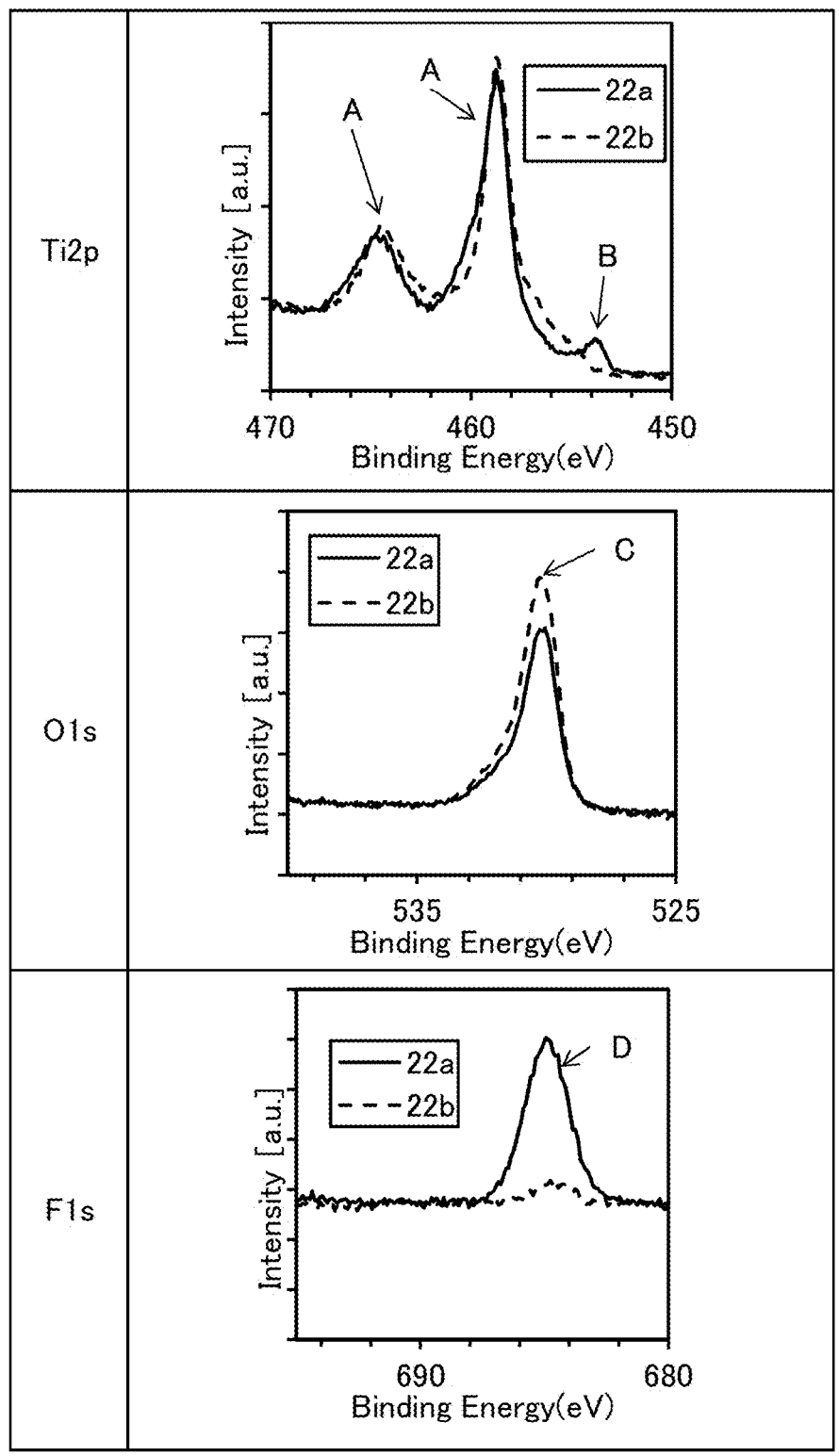
FIG. 22 is XPS analysis results.

As the results of XPS analysis, the Ti2p spectrum, the O1s spectrum, and the F1s spectrum are shown in FIG. 22. In each graph, the result for the metal compound layer 22a and the result for the metal compound layer 22b are shown, overlapping with each other. In FIG. 22, the vertical axis represents intensity and the horizontal axis represents binding energy.

The peak A shown in the Ti2p spectrum is a peak indicating $TiO_2$. The peak A was observed in each of the metal compound layer 22a and the metal compound layer 22b.

The peak B shown in the Ti2p spectrum is a peak indicating Ti. The peak B was observed in the metal compound layer 22a on the formation substrate 10 side.

The peak C shown in the O1s spectrum is a peak indicating a bond with metal (e.g., Ti—O or Ti—OH). The peak C was observed in each of the metal compound layer 22a and the metal compound layer 22b.

The peak D shown in the F1s spectrum is a peak indicating a bond with metal (e.g., Ti—F). The peak C was observed in each of the metal compound layer 22a and the metal compound layer 22b, particularly in the metal compound layer 22a on the formation substrate 10 side.

The quantitative value (unit: atomic %) of each atom obtained by the XPS analysis is shown in Table 1. Note that the determination precision in the XPS analysis was approximately ±1 atomic %.

TABLE 1

|  | Ti | O | F | N | Si |
|---|---|---|---|---|---|
| Metal compound layer 22b (Resin layer 32 side) | 30.6 | 66.1 | 2.6 | 0.3 | 0.3 |
| Metal compound layer 22a (Formation substrate 10 side) | 28.7 | 48.1 | 22.4 | 0.6 | 0.2 |

It was found from Table 1 that the metal compound layer 22b contained a larger amount of oxygen than the metal compound layer 22a, and the metal compound layer 22a contained a larger amount of fluorine than the metal compound layer 22b.

Figure 23:
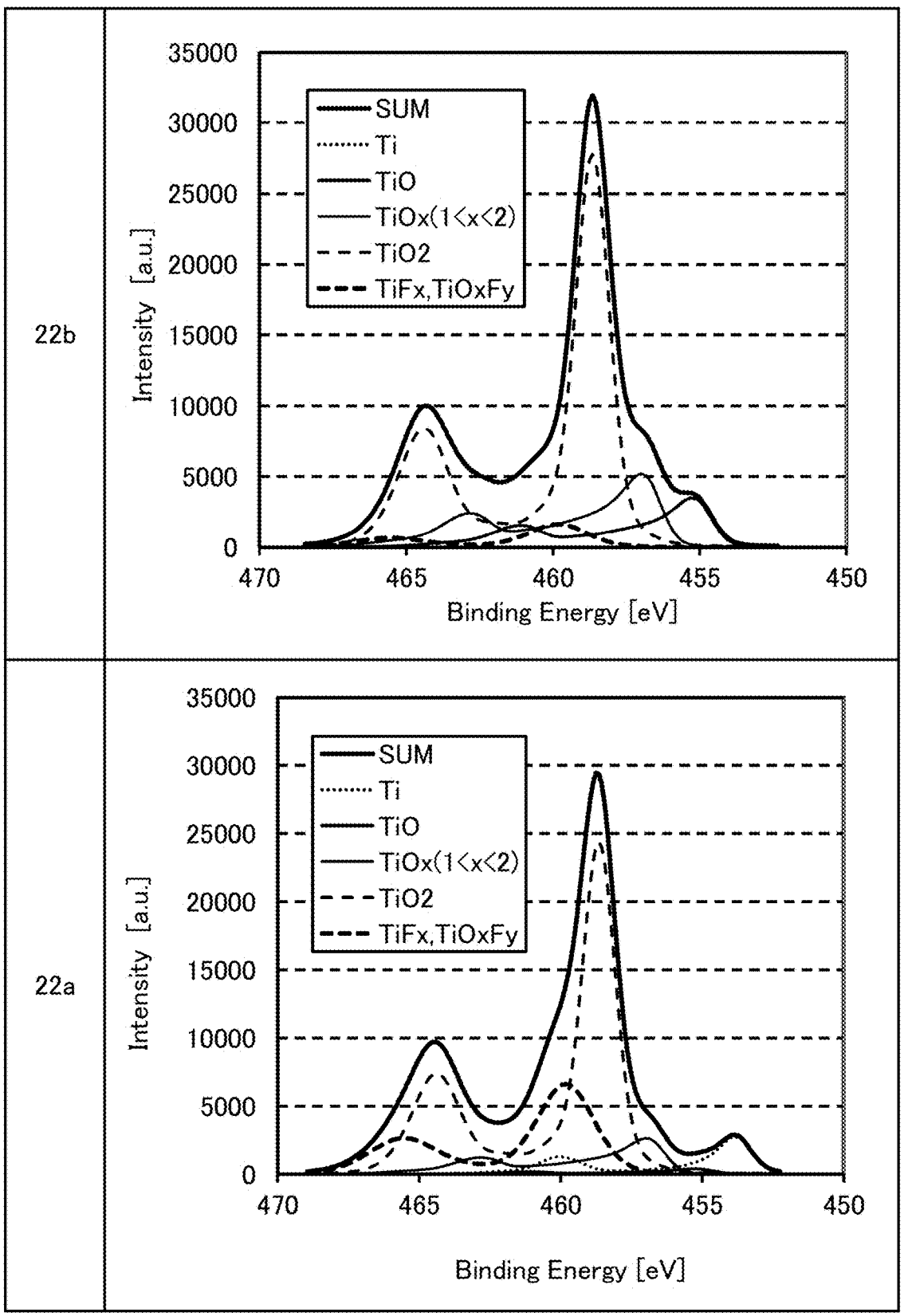
FIG. 23 is XPS analysis results.

As shown in FIG. 22, a high peak indicating a bond of Ti—F was detected in the metal compound layer 22a on the formation substrate 10 side. Then, to examine the detail of the bonding state of Ti and F, curve fitting of the Ti2p spectrum was performed. FIG. 23 shows the results of waveform separation of the Ti2p spectrum for each of the metal compound layer 22a and the metal compound layer 22b. In FIG. 23, the vertical axis represents intensity, and the horizontal axis represents binding energy. In addition, SUM shows the spectrum before the curve fitting.

The composition ratio (unit: %) in the Ti2p spectrum is shown in Table 2.

TABLE 2

|  | Ti | TiO | $TiO_x$ ($1 < x < 2$) | $TiO_2$ | $TT_x$, $TiO_xF_y$ |
|---|---|---|---|---|---|
| Metal compound layer 22b (Resin layer 32 side) | 0.0 | 12.9 | 19.4 | 61.7 | 6.0 |
| Metal compound layer 22a (Formation substrate 10 side) | 8.1 | 1.5 | 10.1 | 55.6 | 24.7 |

The results in FIG. 23 and Table 2 indicated that fluorine existed as $TiF_x$ and $TiO_xF_y$ at the separation interface. The metal compound layer 22a on the formation substrate 10 side was found to contain more bonds with fluorine than the metal compound layer 22b does. In contrast, the metal compound layer 22b on the resin layer 32 side was found to contain more bonds with oxygen than the metal compound layer 22a does.

From the above, it was found that the compositions of the two metal compound layers were different from each other.

[Sample Fabrication 2]

In the sample fabrication 1, the surface of the metal layer 20 was subjected to $C_4F_8$ plasma treatment, and then $H_2O$ plasma treatment. Here, conditions of the plasma treatment to be performed on the metal layer 20 were changed, and separation evaluation was performed.

The fabrication method of the samples was the same as that of the sample fabrication 1 except the steps of plasma treatment.

Here, three samples were used. As shown in Table 3, Sample 1 was subjected to only $C_4F_8$ plasma treatment, Sample 2 was subjected to $H_2O$ plasma treatment, and then $C_4F_8$ plasma treatment, and Sample 3 was subjected to $C_4F_8$ plasma treatment, and then $H_2O$ plasma treatment in the same way as the above-described sample fabrication 1.

TABLE 3

|  | Plasma treatment |
|---|---|
| Sample 1 | $C_4F_8$ |
| Sample 2 | $H_2O \rightarrow C_4F_8$ |
| Sample 3 | $C_4F_8 \rightarrow H_2O$ |

[Separation 2]

Of the three samples, the only sample in which the functional layer 25 was able to be separated from the formation substrate 10 without any defects was Sample 3. Note that for each of the samples, a separation starting point was formed and separation was attempted while water was supplied to the separation surface.

In Sample 1 and Sample 2, the step right after the $C_4F_8$ plasma treatment was the step of processing the metal layer 20 (or the metal compound layer 22) (when the plasma treatment was performed before forming the metal layer 20 into an island shape, for example) or the step of applying the material of the first layer 30. The surface of the metal layer 20 (or the metal compound layer 22) after the $C_4F_8$ plasma treatment repelled the resist or the material of the first layer 30, which prevented the steps from progressing normally.

In contrast, in Sample 3, the step of processing the metal layer 20 (or the metal compound layer 22) or the step of applying the material of the first layer 30 was carried out after the $H_2O$ plasma treatment was performed; thus, the resist or the material of the first layer 30 was prevented from being repelled and the steps progressed normally. Then, as in Example 1, the functional layer 25 was able to be separated from the formation substrate 10 without any defects.

The above results indicated that the types and the order of plasma treatment were important elements of the separation method of one embodiment of the present invention. Specifically, it was found that subjecting the surface of the metal layer 20 to the $C_4F_8$ plasma treatment and then the $H_2O$ plasma treatment enabled the functional layer 25 to be separated from the formation substrate 10 without any defects.

The above results demonstrated that the use of the separation method of one embodiment of the present invention enabled the functional layer 25 to be separated from the formation substrate 10 without a step of irradiating a wide area of the formation substrate 10 with laser light. It was also demonstrated that the force required for the separation could be reduced by water supplied to the separation interface. In the STEM cross-sectional observation, it was found that the metal compound layer 22 before the separation was divided into two (upper and lower) layers, and unevenness was generated at the interface between the two layers. Furthermore, from the results of STEM-EDX analysis, it was found that the boundary between the two layers, the vicinity thereof, and the bumps formed on the lower layer were high in fluorine. From the cross-sectional observation after each step, it was found that the metal compound layer was divided into two layers after the first plasma treatment, and unevenness was generated at the interface between the two layers after the heat treatment. From the results of the SEM observation and XPS analysis of the surface exposed by the separation, it was found that unevenness was generated and fluorine existed on the separation surface. This indicated that the separation occurred along the interface between the two (upper and lower) layers formed in the metal compound layer.

DESCRIPTION OF REFERENCE NUMERALS

10: formation substrate, 13: adhesive layer, 14: substrate, 15A: display device, 15B: display device, 20: metal layer, 21: metal compound layer, 22: metal compound layer, 22a: metal compound layer, 22b: metal compound layer, 25: functional layer, 26: liquid feeding mechanism, 27a: plasma, 27b: plasma, 28: adhesive layer, 29: substrate, 30: layer, 31: insulating layer, 32: resin layer, 33: insulating layer, 34: insulating layer, 35: insulating layer, 40: transistor, 41: conductive layer, 42: insulating layer, 43a: conductive layer, 43b: conductive layer, 43c: conductive layer, 44: metal oxide layer, 45: conductive layer, 49: transistor, 60: light-emitting element, 61: conductive layer, 62: EL layer, 63: conductive layer, 64: cut, 65: instrument, 74: insulating layer, 75: protective layer, 75a: substrate, 75b: adhesive layer, 76: connector, 80: transistor, 81: conductive layer, 82: insulating layer, 83: metal oxide layer, 84: insulating layer, 85: conductive layer, 86a: conductive layer, 86b: conductive layer, 86c: conductive layer, 91: formation substrate, 92: metal compound layer, 92a: metal compound layer, 92b: metal compound layer, 93: resin layer, 95: insulating layer, 96: partition, 97: coloring layer, 98: light-blocking layer, 99: adhesive layer, 140: transistor, 231: display region, 372: FPC, 381: display portion, 382: driver circuit portion, 510: base, 700: display device, 700A: region, 700B: region, 700C: region, 705: sealant, 770: base, 791: member, 791A: elastic body, 791B: elastic body, 791C: elastic body, 792: member, 800: portable information terminal, 801: housing, 802: housing, 803: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 830: portable information terminal, 831: housing, 832: display region, 832a: display region, 832b: display region, 832c: display region, 840: portable information terminal, 841: housing, 842: display region, 842a: display region, 842b: display region This application is based on Japanese Patent Application Serial No. 2017-237751 filed with Japan Patent Office on Dec. 12, 2017, the entire contents of which are hereby incorporated herein by reference.

The invention claimed is:

1. A method of fabricating a semiconductor device, comprising the steps of:
   forming a metal layer over a substrate;
   forming a first metal compound layer by supplying fluorine to the metal layer;
   forming a second metal compound layer by oxidizing the first metal compound layer;
   forming a functional layer over the second metal compound layer;
   performing heat treatment on the second metal compound layer; and
   separating the functional layer from the substrate with use of one or both of the first metal compound layer and the second metal compound layer.

2. The method of fabricating a semiconductor device according to claim 1,
   wherein a first layer containing a resin or a resin precursor is formed over and in contact with the second metal compound layer, and
   wherein a resin layer is formed by heating the first layer by the heat treatment.

3. The method of fabricating a semiconductor device according to claim 1,
   wherein the first plasma treatment is $C_4F_8$ plasma treatment.

4. The method of fabricating a semiconductor device according to claim 1,
   wherein the second plasma treatment is $H_2O$ plasma treatment.

5. The method of fabricating a semiconductor device according to claim 1,
   wherein the metal layer comprises one or more of titanium, molybdenum, aluminum, tungsten, indium, zinc, gallium, tantalum, and tin.

6. The method of fabricating a semiconductor device according to claim 1,
   wherein the second metal compound layer comprises a first layer over the substrate and a second layer over the first layer,
   wherein the first layer comprises a larger amount of metal than the second layer,
   wherein the second layer comprises a larger amount of oxygen than the first layer, and
   wherein the second metal compound layer comprises, at an interface between the first layer and the second layer or in a vicinity of the interface, a region comprising a larger amount of fluorine than the other region.

7. The method of fabricating a semiconductor device according to claim 1,
   wherein the metal layer comprises one or more of titanium, molybdenum, aluminum, tungsten, indium, zinc, gallium, tantalum, and tin.

8. The method of fabricating a semiconductor device according to claim 1,
   wherein the second metal compound layer comprises a first layer over the substrate and a second layer over the first layer,
   wherein the first layer comprises a larger amount of metal than the second layer,
   wherein the second layer comprises a larger amount of oxygen than the first layer, and
   wherein the second metal compound layer comprises, at an interface between the first layer and the second layer or in a vicinity of the interface, a region comprising a larger amount of fluorine than the other region.

9. A method of fabricating a semiconductor device, comprising the steps of:
   forming a metal layer over a substrate;
   forming a first metal compound layer by performing first plasma treatment using a gas containing fluorine on the metal layer;
   forming a second metal compound layer by performing second plasma treatment using a gas containing oxygen on the first metal compound layer;
   forming a functional layer over the second metal compound layer;
   performing heat treatment on the second metal compound layer; and separating the functional layer from the substrate with use of one or both of the first metal compound layer and the second metal compound layer.

10. The method of fabricating a semiconductor device according to claim 9,
wherein the first plasma treatment is $C_4F_8$ plasma treatment.

11. The method of fabricating a semiconductor device according to claim 9,
wherein the second plasma treatment is $H_2O$ plasma treatment.

12. The method of fabricating a semiconductor device according to claim 9,
wherein the metal layer comprises one or more of titanium, molybdenum, aluminum, tungsten, indium, zinc, gallium, tantalum, and tin.

13. The method of fabricating a semiconductor device according to claim 9,
wherein the second metal compound layer comprises a first layer over the substrate and a second layer over the first layer,
wherein the first layer comprises a larger amount of metal than the second layer,
wherein the second layer comprises a larger amount of oxygen than the first layer, and
wherein the second metal compound layer comprises, at an interface between the first layer and the second layer or in a vicinity of the interface, a region comprising a larger amount of fluorine than the other region.

14. A method of fabricating a semiconductor device, comprising the steps of:
forming a metal layer over a substrate;
forming a first metal compound layer by performing first plasma treatment using a gas containing fluorine on the metal layer;
forming a second metal compound layer by performing second plasma treatment using a gas containing oxygen on the first metal compound layer;
forming a first layer containing a resin or a resin precursor over the second metal compound layer;
forming a resin layer by heating the first layer; and
separating the resin layer from the substrate with use of one or both of the first metal compound layer and the second metal compound layer.

15. The method of fabricating a semiconductor device according to claim 14,
wherein the resin layer comprises one or both of a polyimide resin and an acrylic resin.

16. The method of fabricating a semiconductor device according to claim 14,
wherein the first plasma treatment is $C_4F_8$ plasma treatment.

17. The method of fabricating a semiconductor device according to claim 14,
wherein the second plasma treatment is $H_2O$ plasma treatment.

18. The method of fabricating a semiconductor device according to claim 14,
wherein the metal layer comprises one or more of titanium, molybdenum, aluminum, tungsten, indium, zinc, gallium, tantalum, and tin.

19. The method of fabricating a semiconductor device according to claim 14,
wherein the second metal compound layer comprises a first layer over the substrate and a second layer over the first layer,
wherein the first layer comprises a larger amount of metal than the second layer,
wherein the second layer comprises a larger amount of oxygen than the first layer, and
wherein the second metal compound layer comprises, at an interface between the first layer and the second layer or in a vicinity of the interface, a region comprising a larger amount of fluorine than the other region.

* * * * *